United States Patent [19]
Homma et al.

[11] Patent Number: 5,776,829
[45] Date of Patent: Jul. 7, 1998

[54] METHOD FOR FORMING MULTILEVEL INTERCONNECTIONS IN A SEMICONDUCTOR DEVICE

[75] Inventors: Tetsuya Homma; Makoto Sekine, both of Tokyo, Japan

[73] Assignee: NEC Corporation, Tokyo, Japan

[21] Appl. No.: 561,881

[22] Filed: Nov. 22, 1995

[30] Foreign Application Priority Data

Nov. 22, 1994 [JP] Japan .................................. 6-287741

[51] Int. Cl.$^6$ .................................................. H01L 21/441
[52] U.S. Cl. ........................ 438/641; 438/778; 438/674
[58] Field of Search ........................... 437/195, 235, 437/228 LO, 228 M, 192, 194; 438/641, 674, 778, 787; 427/96, 601, 430.1, 169; 148/DIG. 101, DIG. 118

[56] References Cited

U.S. PATENT DOCUMENTS

| 5,304,510 | 4/1994 | Suguro et al. | 437/195 |
| 5,326,720 | 7/1994 | Goda et al. | 437/130 |
| 5,328,873 | 7/1994 | Mikoshiba et al. | 437/187 |

FOREIGN PATENT DOCUMENTS 6-216128  8/1994  Japan .

OTHER PUBLICATIONS

S. Gonzales et al. "Performance of a sequentially deposited Ti/TiN/AlCuSi Metallization Structure" Proc. 1991 IEEE VLSI Multilevel Interconnect Conf. (Jun. 11–12 1991) pp. 316–319.

*Primary Examiner*—Caridad Everhart
*Attorney, Agent, or Firm*—Young & Thompson

[57] ABSTRACT

The present invention provides a novel method for forming multilevel interconnections in a semiconductor device. A silicon oxide film is formed on a semiconductor substrate. A first photo-resist film pattern is formed on the first silicon oxide film. The surface of the silicon oxide film covered with the photo-resist film pattern is exposed to a super-saturated hydrosilicofluoric acid solution to selectively deposit a first fluoro-containing silicon oxide film on the silicon oxide film by use of the first photo-resist film pattern as a mask. The first photo-resist film pattern is removed, thereby resulting in first grooves in the fluoro-containing silicon oxide film. First interconnections are formed within the first grooves. An inter-layer insulator is formed on an entire surface of the device and then subjected to a dry etching and a photolithography to form via holes in the inter-layer insulator. Conductive films are selectively formed in the via holes. A second photo-resist film pattern is selectively formed to cover the conductive films within the via holes. The entire surface of the device covered with the second photo-resist film pattern is exposed to a super-saturated hydrosilicofluoric acid solution to selectively deposit a second fluoro-containing silicon oxide film on the inter-layer insulator by use of the second photo-resist film pattern as a mask. The second photo-resist film pattern is removed, thereby resulting in second grooves in the second fluoro-containing silicon oxide film. Second interconnections are formed within the second grooves.

4 Claims, 29 Drawing Sheets

METHOD FOR FORMING MULTILEVEL INTERCONNECTIONS IN A SEMICONDUCTOR DEVICE

BACKGROUND OF THE INVENTION

The present invention relates to a method for forming multilevel interconnections in a semiconductor device.

In order to increase the density of integration of the semiconductor device, scaling down of the interconnections and increase in the number of levels thereof are necessary. Surface planarization of an inter-layer insulator is essential to obtain the scaling down of the interconnections. The accuracy of the scale of the interconnections formed on the inter-layer insulator largely depends upon the degree of the surface planarization of the inter-layer insulator. The increase in the number of the interconnection level enlarges a difference in level, or a height of the step, of the upper interconnection. If the difference in level of the upper interconnection is beyond the depth of focus in the photo-lithography, then the scale of the interconnection is different between the upper and lower parts bounded by the step. In order to improve the accuracy of the size of the interconnections, it is essential to reduce the step as much as possible.

In the prior art, the following forming process for the inter-layer insulator is often used. A first silicon oxide film is deposited by a plasma chemical vapor deposition method. A spin-on-glass film is formed on the first silicon oxide film in order to obtain a planarized surface. A second silicon oxide film is deposited on the spin-on-glass film by the plasma chemical vapor deposition method. The planarization method using an SOG film is effective to planarize a portion at which many narrow interconnections are concentrated. In this case, the SOG film is formed as thin over narrow interconnections and is formed as thick over wide interconnections. As a result, it is difficult to completely planarize an entire surface of a chip, thereby causing the variation in size of interconnections formed on the inter-layer insulator. This means that it is difficult to form fine interconnections.

The requirement for completely planarizing the inter-layer insulator has been on the increase. In order to facilitate the planarization, it is effective to provide a silicon oxide film with grooves which receive interconnections being made of tungsten. This technique is disclosed in VLSI Multilevel Interconnection Conference Proceedings, June 1992 pp. 22–28. The tungsten film is immersed in a contact portion of 64 Mbit DRAM. A first interconnection layer comprises a tungsten film which is immersed in an interconnection groove of the silicon oxide film. A second interconnection layer comprises a lamination structure of an aluminum film and a tungsten film. Detail descriptions of the above technique will be described below with reference to FIGS. 1A–1H.

As illustrated in FIG. 1A, a first insulating film 2, which is made of silicon oxide, is formed on a silicon substrate 1. A second insulating film 4, which is made of silicon oxide film, is formed on the first insulating film 2.

As illustrated in FIG. 1B, a photo-resist film 27 is applied on the second insulating film 4 and then patterned to form a photoresist pattern 27.

As illustrated in FIG. 1C, the second insulating film is subjected to a reactive ion etching using fluorine gas to form first interconnection grooves 5 in the second insulating film 4.

As illustrated in FIG. 1D, a titanium film 6-1 is formed by sputtering on the side walls and the bottom of each of the first interconnection grooves 5 and on the top of the second insulating film 4. A titanium nitride film 7-1 is formed by sputtering on the titanium film 6-1. A tungsten film 8-1 is grown on an entire surface of the titanium nitride film 7-1 by a chemical vapor phase deposition method using $WF_6$ gas and $SiH_4$ gas wherein $SiH_4$ is reduced. As a result, the first interconnection grooves 5 are filled with the tungsten film 8-1 and the top of the titanium nitride film 7-1 is completely immersed within the tungsten film 8-1.

As illustrated in FIG. 1E, the tungsten film 8-1, the titanium nitride film 7-1 and the titanium film 6-1 are selectively removed by a chemical/mechanical polishing so that the tungsten film 8-1, the titanium nitride film 7-1 and the titanium film 6-1 remain only within the first interconnection grooves 5. As a result, first interconnections 9-1, which comprises the titanium film 6-1, the titanium nitride film 7-1 and the tungsten film 8-1, are formed within the first interconnection grooves 5.

As illustrated in FIG. 1F, a second insulating film 13, which is made of silicon oxide, is formed on the level surface of the device, wherein the second insulating film 13 acts as an inter-layer insulator. Via holes 15 are selectively formed in the second insulating film 13 by a combination of photo-lithography and reactive ion-etching. The via holes 15 are positioned over the remaining tungsten film 8-1 within the first interconnection grooves 5. The top of the first interconnections 9-1 are covered by the second insulating film 13.

As illustrated in FIG. 1 G, a titanium film 6-2 is formed by sputtering on the side walls and the bottom of each of the via holes 15 and on the top of the second insulating film 13. A titanium nitride film 7-2 is formed by sputtering on the titanium film 6-2. A tungsten film 8-2 is grown on an entire surface of the titanium nitride film 7-2 by a chemical vapor phase deposition method using $WF_6$ gas and $SiH_4$ gas, wherein $SiH_4$ is reduced. As a result, the via holes 15 are filled with the tungsten film 8-2 and the top of the titanium nitride film 7-2 is completely immersed within the tungsten film 8-2. The tungsten film 8-2, the titanium nitride film 7-2 and the titanium film 6-2 are selectively removed by a chemical/mechanical polishing so that the tungsten film 8-2, the titanium nitride film 7-2 and the titanium film 6-2 remain only within the via holes 15. As a result, the contacts 9-2, which comprises the titanium film 6-2 and the titanium nitride film 7-2, are formed within the via holes 15.

As illustrated in FIG. 1H, an insulating film 16, which is made of silicon oxide, is formed on the surface of the device. A photo-resist film, which is not illustrated, is applied on the insulating film 16 and then patterned to form a photoresist pattern, which is not illustrated. The insulating film 16 is subjected to a reactive ion etching using fluorine gas to form second interconnection grooves 18 in the insulating film 16. A titanium film 20 is formed by sputtering on the side walls and the bottom of each of the second interconnection grooves 18 and on the top of the insulating film 18. An aluminum film 21 is formed by sputtering on the titanium film 20 within the second interconnection grooves 18. A tungsten nitride film 22 is formed on the aluminum film 21 within the interconnection grooves 18. A tungsten film 23 is grown on an entire surface of the device by a chemical vapor phase deposition method using $WF_6$ gas and $SiH_4$ gas, wherein $SiH_4$ is reduced. As a result, the second interconnection grooves 18 are completely filled with the tungsten film 23. The tungsten film 23 are selectively removed by a chemical/mechanical polishing so that the tungsten film 23, the tungsten untried film 22, the aluminum film 21 and the titanium film 20 remain only within the second interconnection grooves 18. As a result, second interconnections are formed within the second interconnection grooves 18. Each of the interconnections comprises the tungsten film 23, the tungsten nitride film 22, the aluminum film 21 and the titanium film 20.

The above conventional method for forming the multilevel interconnections has the following disadvantages. As described above, the interconnection grooves for receiving the interconnections are formed by subjecting the silicon oxide film 4 to the reactive ion-etchinlg. The silicon oxide film 4 overlays the silicon oxide film 2. The silicon oxide film 4 has a not large selective ratio in reactive ion-etching to the silicon oxide film 2. Thus, the etching rate of the silicon oxide film 4 is not much larger than the etching ratio of the silicon oxide film 2. For that reason, it is difficult to precisely control the etching depth. The reactive ion-etching depends on the pattern due to micro-loading effect. For example, the etching depth is varied by the variation in the width of the interconnection groove. The depth of the interconnection groove corresponds to the thickness of the interconnections. When the depth of the interconnection groove has a variation, this means that the interconnection thickness also has a variation, thereby resulting in deterioration of the reliability of the interconnections.

There is another conventional method for forming multilevel interconnections, which will hereinafter be described with reference to FIGS. 2A–2E. In order to form the multilevel interconnections by both a liquid phase growth of a silicon oxide film and a non-electro-plating. This technique is the same as disclosed in the Japanese laid-open patent application No. 4-290249. The process for forming the multilevel interconnections are as follows.

As illustrated in FIG. 2A, a silicon oxide film 2 is formed on a silicon substrate 1. A copper film 24, having a thickness of 100 nanometers, is formed on the silicon oxide film 2 by sputtering.

As illustrated in FIG. 2B, a photo-resist film is applied on the copper film 24 and then pattered to form a first photo-resist pattern 3. The copper film 24 is selectively etched by using the first photo-resist pattern 3 as a mask. A fluoro-containing silicon oxide film 4 is selectively grown by a liquid phase growth method using the first photo-resist pattern 3 as a mask, so that the fluoro-containing silicon oxide film 4 is formed in apertures defined by the first photo-resist pattern 3.

As illustrated in FIG. 2C, the first photo-resist pattern 3 is removed. A first copper plating film 25 is selectively formed by a non-electro-plating method on the copper film 24 in apertures defined by the fluoro-containing silicon oxide film 4.

As illustrated in FIG. 2D, a photo-resist film is applied on the copper film 24 and then pattered to form a second photo-resist pattern 11 on a predetermined part of the first copper plating film 25. A fluoro-containing silicon oxide film 13A is selectively grown by a liquid phase growth method using the second photo-resist pattern 11 as a mask, so that the fluoro containing silicon oxide film 13A is formed in apertures defined by the second photo-resist pattern 11.

As illustrated in FIG. 2E, the second photo-resist pattern 11 is removed. A second copper plating film 26 is selectively formed by a non-electro-plating method on the first copper plating film 25 in apertures defined by the fluoro-containing silicon oxide film 13A.

The above method for forming the interconnections has the following disadvantages. As described above, the non-electro-plating of a metal is used to fill the grooves and the holes with the metal. The metal has to be selected from limited groups, such as gold, copper and nickel, suitable for the metal plating. It is difficult to form the interconnections by use of the sputtering and the chemical vapor deposition. In order to form the silicon oxide film, there has to be used an $H_2SiF_6$ liquid in which HF is included. Even when a boric acid is added to cause a supersaturation state, HF dissociates by extracting silicon oxide. For this reason, it is impossible to use metals, such as aluminum, which are soluble to HF. Copper tends to be oxidized. In the plating method using a liquid, the copper surface under the via hole tends to be oxidized. The oxidized surface of the copper film acts as an insulator, whereby an electrical connection between the first and second interconnections can not be obtained.

SUMMARY OF THE INVENTION

Accordingly, it is an object of the present invention to provide a novel method for forming interconnections free from any disadvantages as described above.

It is a further object of the present invention to provide a novel method for forming interconnections, which permits variable materials to be used for the interconnections.

It is a further more object of the present invention to provide a novel method for forming interconnections with a uniform thickness.

It is a moreover object of the present invention to provide a novel method for forming multilevel interconnection structure with a high reliability.

It is a still further object of the present invention to provide a novel method for forming multilevel interconnections which are electrically connected to each other.

It is yet a further object of the present invention to provide a novel method for forming multilevel fine interconnections being planarlized.

The above and other objects, features and advantages of the present invention will be apparent from the following descriptions.

The present invention provides a novel method for formingl multilevel interconnections in a semiconductor device. A silicon oxide film is formed on a semiconductor substrate. A first photo-resist film pattern is formed on the first silicon oxide film. The surface of the silicon oxide film covered with the photo-resist film pattern is exposed to a super-saturated hydrosilicofluoric acid solution to selectively deposit a first fluoro-containing silicon oxide film on the silicon oxide film by use of the first photo-resist film pattern as a mask. The first photo-resist film pattern is removed, thereby resulting in first grooves in the fluoro-containing silicon oxide film. First interconnections are formed within the first grooves. An inter-layer insulator is formed on an entire surface of the device and then subjected to a dry etching and a photolithography to form via holes in the inter-layer insulator. Conductive films are selectively formed in the via holes. A second photo-resist film pattern is selectively formed to cover the conductive films within the via holes. The entire surface of the device covered with the second photo-resist film pattern is exposed to a super-saturated hydrosilicofluoric acid solution to selectively deposit a second fluoro-containing silicon oxide film on the inter-layer insulator by use of the second photo-resist film pattern as a mask. The second photo-resist film pattern is removed, thereby resulting in second grooves in the second fluoro-containing silicon oxide film. Second interconnections are formed within the second grooves.

As modifications, the following process for forming the inter-layer insulator is available. A silicon oxide base film is deposited on an entire surface of the device. A second photo-resist film pattern is selectively formed on the silicon oxide base film to overlay only the first interconnections. The entire surface of the device, covered with the second photo-resist film pattern, is exposed to a super-saturated hiydrosilicofluoric acid solution to selectively deposit a fluoro-containing silicon oxide inter-layer insulator film on the inter-layer insulator by use of the second photo-resist film pattern as a mask. The second photo-resist film pattern is removed, thereby resulting in apertures in the fluoro-containing silicon oxide inter-layer insulator film. The silicon oxide base film shown through the apertures is removed by the reactive ion-etching so as to form via holes in the fluoro containing silicon oxide inter-layer insulator film. A selective chemical vapor deposition method is available to selectively form metal films such as tungsten films within the via holes. The following processes are also available for forming metal films such as tungsten films within the via holes. A metal film is deposited on an entire surface of the device and then subjected to either a dry etching or a chemical/mechanical polishing to have the metal film partially remain in the via holes.

As further modifications, the silicon oxide film may contain at least one of phosphorus, boron and germanium. Such film may be formed by either a sputtering method or a chemical vapor deposition method. The interconnections may be made of a conductive material which includes at least one of titanium nitride, tungsten, molybdenum, gold, silver, copper, silicon, aluminum, titanium, titanium-containing silicon. Such conductive film may be formed by a chemical vapor deposition method or a sputtering method.

The super-saturated hydrosilicofluoric acid solution may be prepared by heating a hydrosilicofluoric solution. The super-saturated hydrosilicofluoric acid solution may also be prepared by dissolving aluminum into a hydrosilicofluoric solution. The super-saturated hydrosilicofluoric acid solution may be prepared by adding either a boric acid solution or water into a hydrosilicofluoric solution.

As described above, the interconnection grooves are formed by a selective growth of the fluoro-containing silicon oxide film without using a reactive ion-etching process. This means that the interconnection grooves are free from any variation in its size due to any variation in the size of a photoresist pattern.

When the inter-layer insulator is formed, the first interconnections which underlying the inter-layer insulator are not exposed to the supersaturated hydrosilicofluoric acid solution so that the first interconnections are free from any corrosion.

When the second fluoro-containing silicon oxide film which overlays the inter-layer insulator is formed, the conductive films in the via holes of the inter-layer insulator are not exposed to the super-saturated hydrosilicofluoric acid solution so that the conductive films are free from any corrosion.

The groves and the via holes are filled with the conductive material to obtain level surfaces for facilitating the planarization.

BRIEF DESCRIPTIONS OF THE DRAWINGS

Preferred embodiments of the present invention will be described in detail with reference to the accompanying drawings.

PREFERRED EMBODIMENTS

A first embodiment according to the present invention will be described with reference to FIGS. 3A–3N, wherein a novel method for forming multilevel interconnections in a semiconductor device is provided.

Figure 1A:
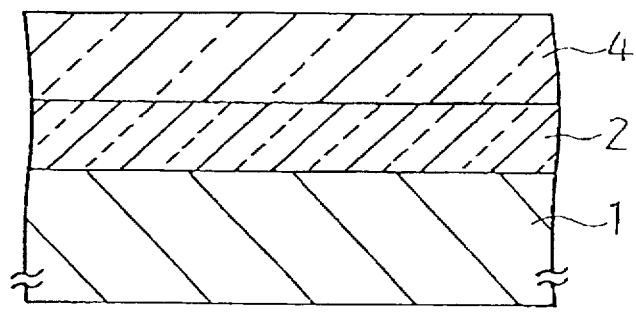
FIGS. 1A–1H are cross sectional elevation views illustrative of the semiconductor device with multilevel interconnections involved in the conventional fabrication method.
Figure 1B:
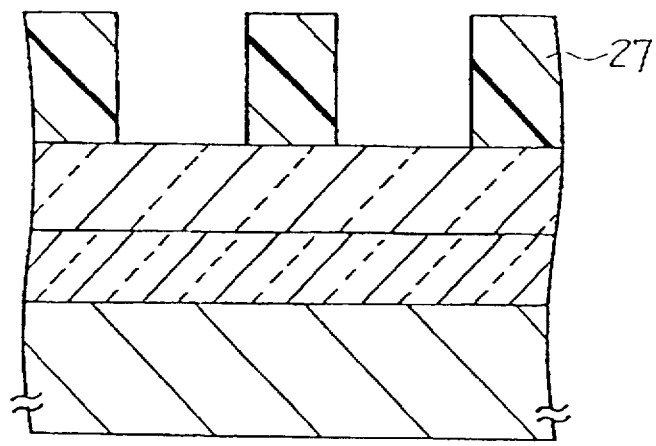
Figure 1C:
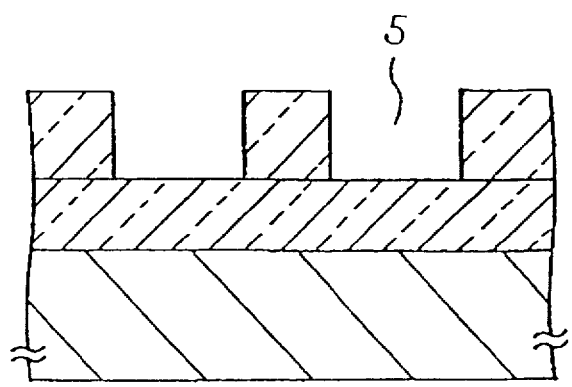
Figure 1D:
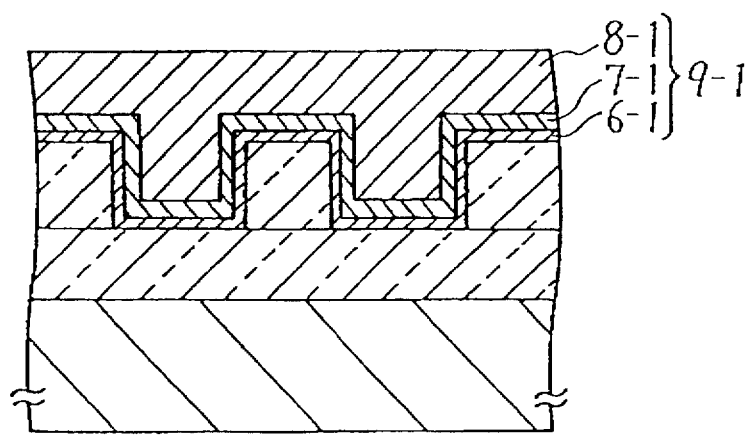
Figure 1E:
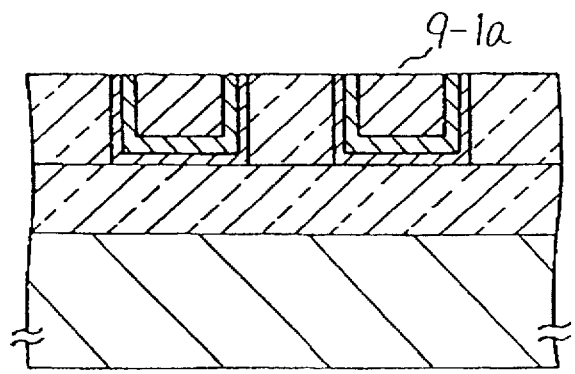
Figure 1F:
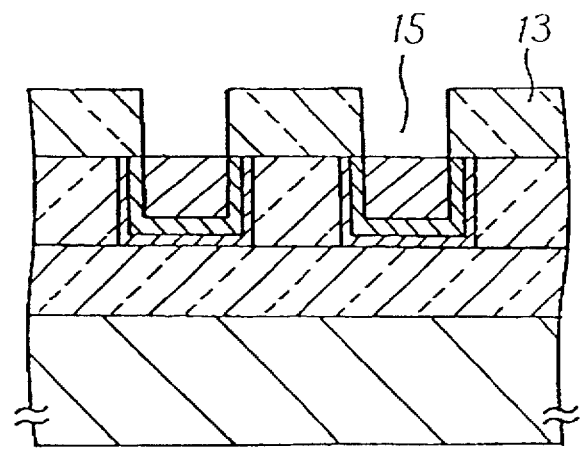
Figure 1G:
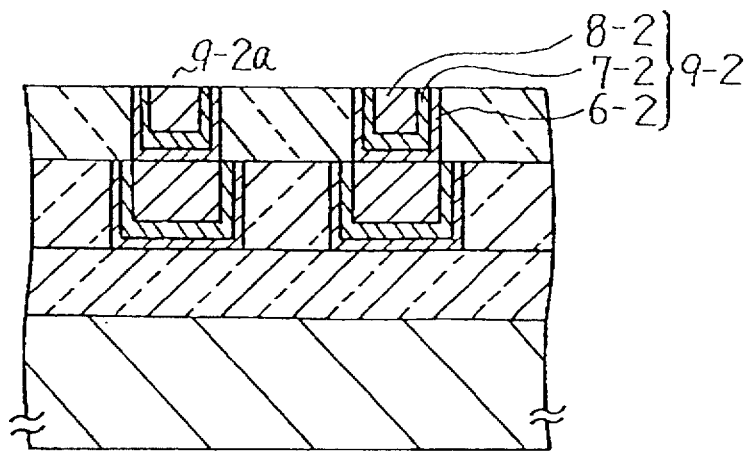
Figure 1H:
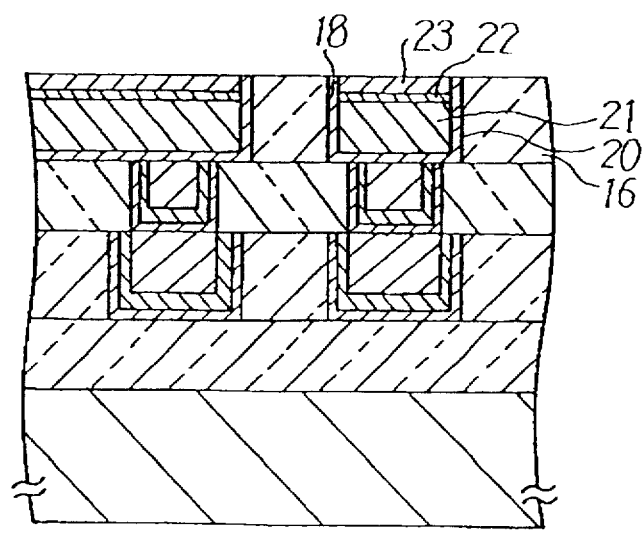
Figure 2A:
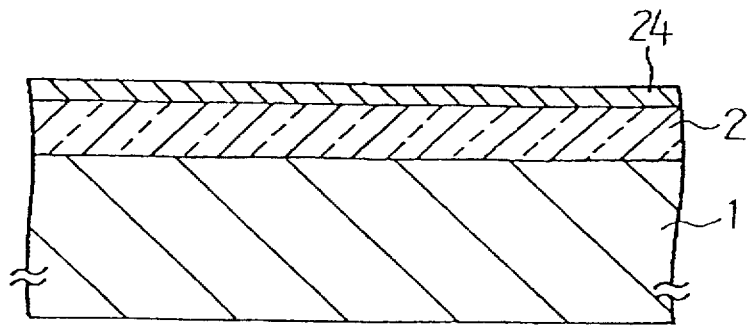
FIGS. 2A–2E are cross sectional elevation views illustrative of the semiconductor device with multilevel interconnections involved in the other conventional fabrication method.
Figure 2B:
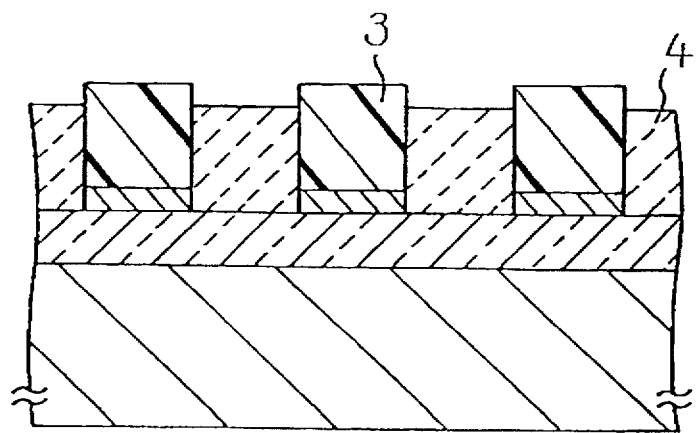
Figure 2C:
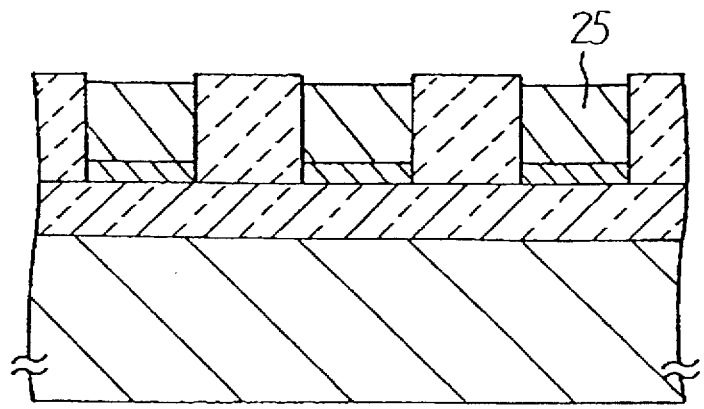
Figure 2D:
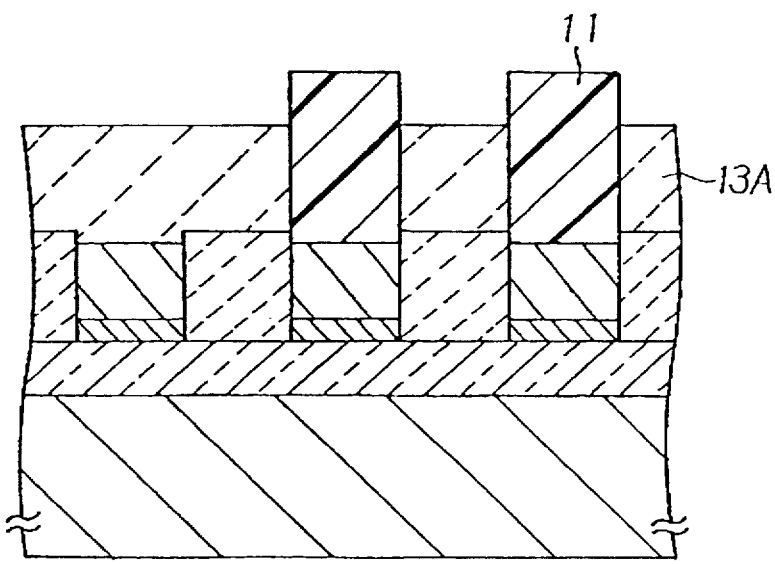
Figure 2E:
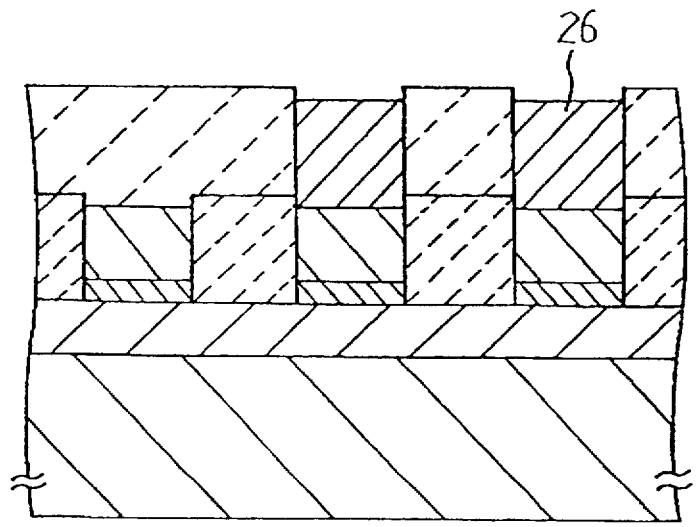
Figure 3A:
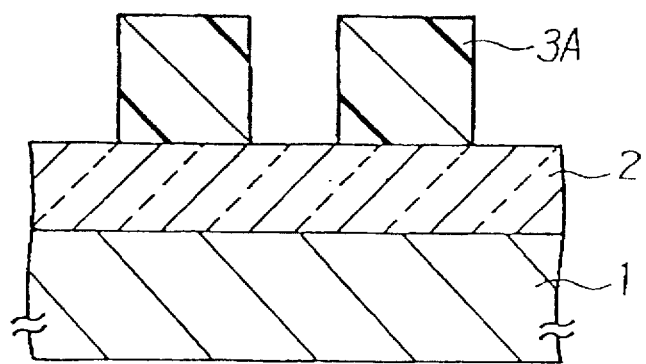
FIGS. 3A–3N are cross sectional elevation views illustrative of a semiconductor device with multilevel interconnections involved in a novel fabrication method in a first embodiment according to the present invention.

As illustrated in FIG. 3A, a first insulating film 2, being made of silicon oxide and having a thickness of 1 micrometer, is formed as a first insulator on a silicon substrate 1 by a plasma chemical vapor deposition method. A photo-resist is applied on the silicon oxide film 2 and then patterned by photo-lithography to form a photo-resist pattern 3A on the first insulating film 2.

Figure 3B:
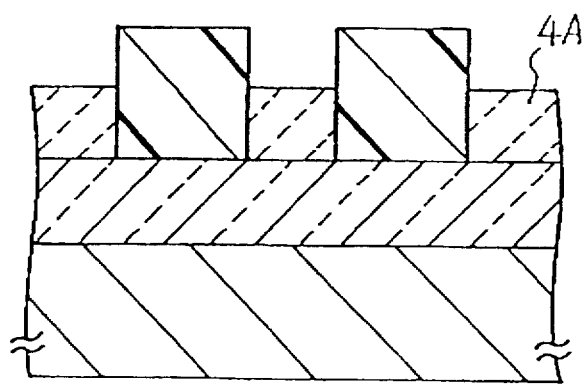

As illustrated in FIG. 3B, a second insulating film 4A, being made of fluoro-containing silicon oxide and having a thickness of 0.8 micrometers, is grown on the first insulating film 2 by using the photo-resist pattern 3A as a mask. The growth of the fluoro-containing silicon oxide film 4A is achieved by a liquid phase growth which uses a super-saturated hydrosilicofluoric acid solution, wherein the hydrosilicofluoric acid in the solution is maintained in super-saturated state by immersing and dissolving an aluminum piece in an aqueous solution which includes a hydrosilicofluoric acid at a concentration of about 40% by weight. The reaction of hydrosilicofluoric acid with aluminum is expressed by the following formulae.

$$H_2SiF_6 + 2H_2O \rightarrow 6HF + SiO_2 \qquad (1)$$

$$Al^{3+} + 3HF \rightarrow AlF_3 + 3H^+ \qquad (2)$$

The above matter is disclosed in the Japanese laid-open patent application No. 62-20876. The reaction of hydrosilicofluoric acid with aluminum, which is expressed by the above formulae (1) and (2), is caused by adding aluminum into the hydrosilicofluoric acid solution. The chemical equilibrium expressed in the left hand term is broken, thereby resulting in an extraction of fluoro-containing silicon oxide so that the fluoro-containing silicon oxide film 4A, which has Si-F bonding, is deposited on the silicon oxide film 2. During the deposition of the fluoro-containing silicon oxide film 4A, the hydrosilicofluoric acid solution is maintained at a temperature of 35° C. so that the solubility of aluminum to 1 liter of hydrosilicofluoric acid solution is set at approximately 0.5 g/hour, thereby resulting in a fluoro-containing silicon oxide film deposition rate being in the range of 80 nanometers to 100 nanometers.

Figure 3C:
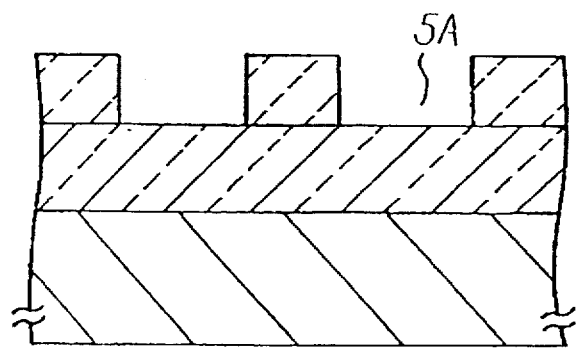

As illustrated in FIG. 3C, only the first photo-resist pattern 3A having apertures, within which the fluoro-containing silicon oxide film 4A is formed, is removed by a peeling liquid so that first interconnection grooves 5A defined by the fluoro-containing silicon oxide film 4A are formed.

Figure 3D:
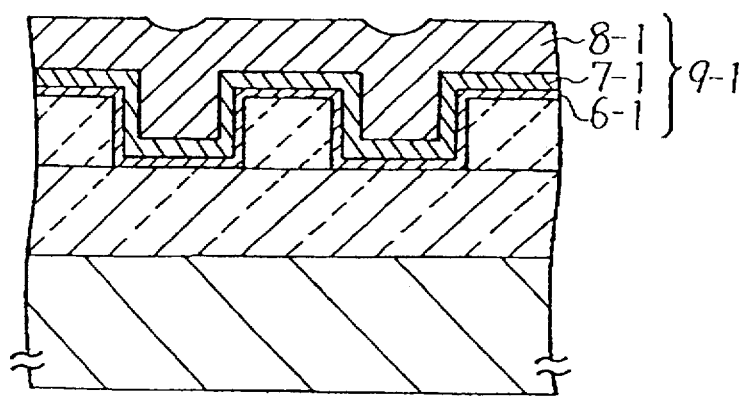

As illustrated in FIG. 3D, the substrate is introduced into a sputtering apparatus and then a vacuum of $1 \times 10^{-5}$ Pa is created. The substrate is subjected to an etching using an argon gas with a pressure of 0.7 Pa to remove a spontaneous oxide film from the surface of the substrate. A titanium film 6-1 with a thickness of approximately 50 nanometers is deposited on an entire surface of the device by a sputtering method. A titanium nitride film 7-1 with a thickness of approximately 100 nanometers is deposited on the titanium film 6-1 by a sputtering method. An aluminum film 8-1 with a thickness of 700 nanometers is formed on the titanium nitride film 7-1 by a chemical vapor deposition, wherein dimethylalminumliydride $AlH(CH_3)_2$ is vaporized by a bubbling method with a carrier gas of hydrogen at a temperature of 30° C. and then introduced into a reaction chamber. The flow rate of hydrogen gas used in the bubbling method is controlled at 250 sccm. The pressure of the reaction chamber is maintained at 130 Pa. The temperature of the substrate is maintained at 250° C. The deposition rate of aluminum is approximately 0.4 micrometers/min.

Figure 3E:
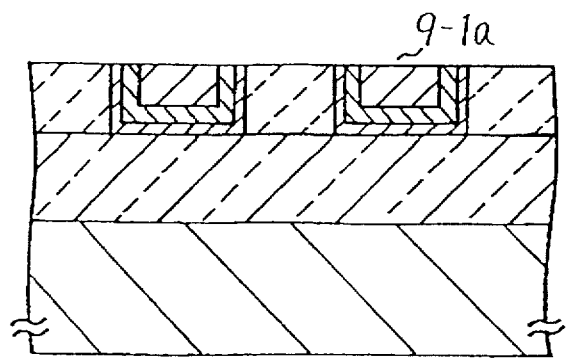

As illustrated in FIG. 3E, the aluminum film 8-1, the titanium nitride film 7-1 and the titanium film 6-1 are selectively removed by a chemical/mechanical polishing to leave the aluminum film 8-1, the titanium nitride film 7-1 and the titanium film 6-1 only within the first interconnection grooves 5A. As a result, the first interconnections, each of which comprises the aluminum film 8-1, the titanium nitride film 7-1 and the titanium film 6-1, are formed in the first interconnection grooves 5A. The polishing is carried out by using an acid polishing agent with a pH value of 2.5 where silicon oxide particles with a diameter of approximately 30 nanometers are dispersed in a pure water. A rotational speed of a polishing pad is maintained at 50 times/min. A rotational speed of a polishing head is also maintained at 50 times/min. The polishing agent is added at a rate of 75 cc/min. The polishing rate is approximately 0.4 micrometers/min.

Figure 3F:
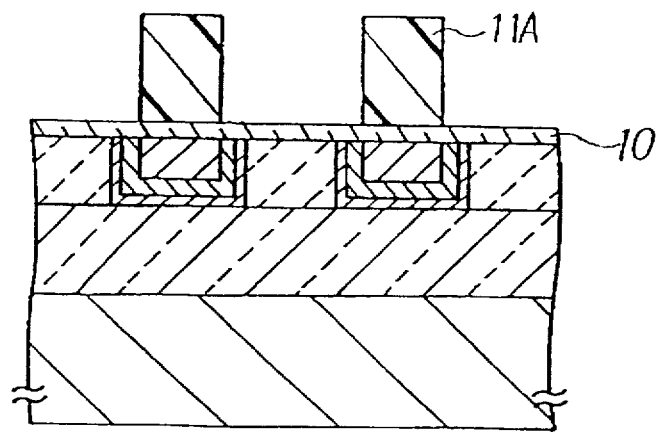

As illustrated in FIG. 3F, a silicon oxide base film 10 with a thickness of approximately 100 nanometers is formed on an entire surface of the device by a plasma chemical vapor deposition. A second photo-resist film is applied on an entire surface of the silicon oxide base film 10 and then patterned to form a second photo-resist pattern 11A which positioned over the aluminum film 8-1 within the first interconnection grooves.

Figure 3G:
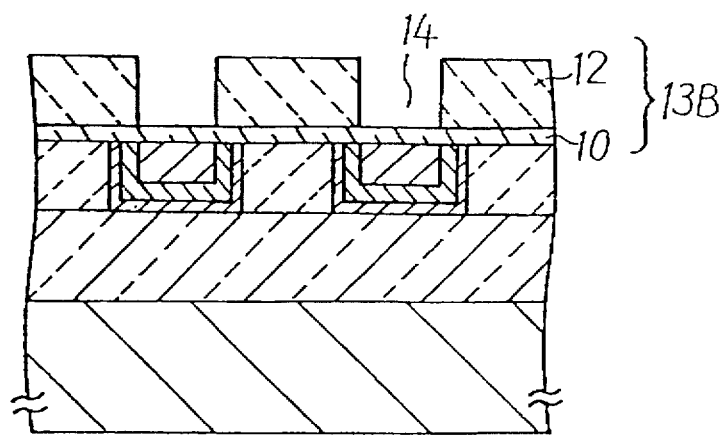

As illustrated in FIG. 3G, a second fluoro-containing silicon oxide film 12 with a thickness of 0.8 micrometers is grown on the silicon oxide base film 10 by using the second photo-resist pattern 11A as a mask. The growth of the fluoro-containing silicon oxide film 12 is achieved by a liquid phase growth which uses a super-saturated hydrosilicofluoric acid solution, wherein the hydrosilicofluoric acid in the solution is maintained in supersaturated state by immersing and dissolving an aluminum piece in an aqueous solution which includes a hydrosilicofluoric acid at a concentration of about 40% by weight. The reaction of hydrosilicofluoric acid with aluminum is expressed by the foregoing formula (1) and (2). The reactions of hydrosilicofluoric acid with aluminum, which are expressed by the above formulae (1) and (2), are caused by adding aluminum into the hydrosilicofluoric acid solution. The chemical equilibrium expressed in the left hand term is broken, thereby resulting in an extraction of fluoro containing silicon oxide so that the second fluoro-containing silicon oxide film 12, which has Si-F bonding, is deposited. During the deposition of the fluoro-containing silicon oxide film 12, the hydrosilicofluoric acid solution is maintained at a temperature of 35° C. so that the solubility of aluminum to 1 liter of hydrosilicofluoric acid solution is set at approximately 0.5 g/hour, thereby resulting in a fluoro-containing silicon oxide film deposition rate being in the range of 80 nanometers to 100 nanometers. The second photo-resist pattern 11 A, having apertures within which the fluoro-containing silicon oxide film 12 is formed, is removed by a peeling liquid so that openings 14 are formed in the fluoro-containing silicon oxide film 12.

Figure 3H:
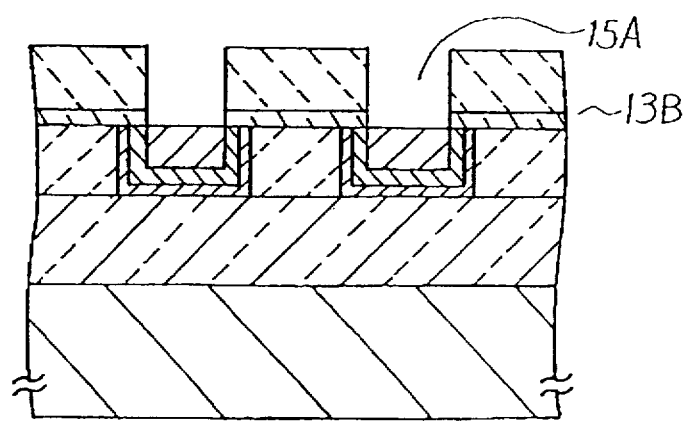

As illustrated in FIG. 3H, the silicon oxide base film 10 under the openings 14 is selectively removed by a reactive dry etching which uses $CF_4$ gas to form via holes 15A over the titanium films 8-1 within the first interconnection grooves 5A. The reactive dry etching is carried out by using a parallel plate type apparatus usable for batch treatments. The flow rate of $CF_4$ gas is maintained at 100 sccm. The pressure of the reaction chamber is set at 10 Pa. The substrate temperature is maintained at 20° C. A power of 1 kW with a frequency of 13.56 MHz is applied. The etching rate of approximately 40 nanometers/min. is obtained. By the etch back process, the thickness of the fluoro-containing silicon oxide film 12 is reduced to approximately 0.65 micrometers. The fluoro-containing silicon oxide film 12 and the silicon oxide base film 10 constitute a third insulator 13B.

Figure 3I:
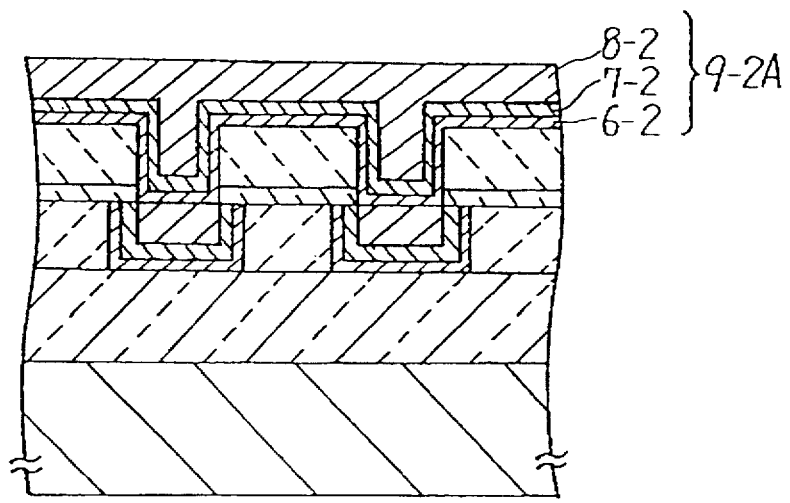

As illustrated in FIG. 3I, a titanium film 6-2 with a thickness of 50 nanometers is deposited on an entire surface of the device by a sputtering method. A titanium nitride film 7-2 with a thickness of 100 nanometers is deposited on the titanium film 6-2 by a sputtering method. An aluminum film 8-2 with a thickness of approximately 0.7 micrometers is formed on the titanium nitride film 7-2 by a thermal chemical vapor phase deposition, wherein dimethylalminumhydride $AlH(CH_3)_2$ is vaporized by a bubbling method with a carrier gas of hydrogen at a temperature of 30° C. and then introduced into a reaction chamber. The flow rate of hydrogen gas used in the hubbling method is controlled at 250 sccm. The pressure of the reaction chamber is maintained at 130 Pa. The temperature of the substrate is maintained at 250° C. The deposition rate of aluminums is approximately 0.4 micrometers/mn.

Figure 3J:
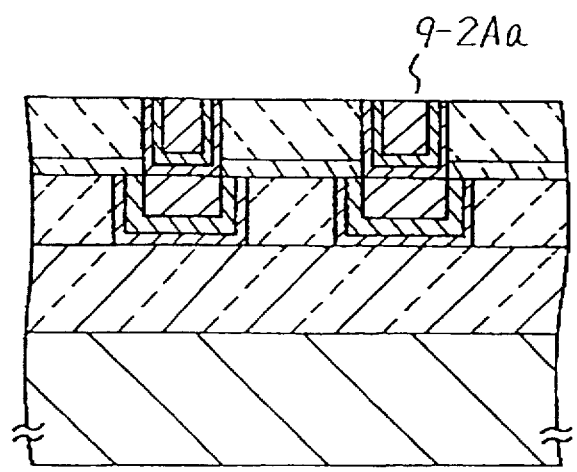

As illustrated in FIG. 3J, the aluminum film 8-2, the titanium nitride film 7-2 and the titanium film 6-2 are selectively removed by a chemical/mechanical polishing to leave the aluminum film 8-2, the titanium nitride film 7-2 and the titanium film 6-2 only within the via holes 15A. As a result, the conductive films, each of which comprises the aluminum film 8-2, the titanium nitride film 7-2 and the titanium film 6-2, are formed in the via holes 15A. The polishing is carried out by using an acid polishing agent with a pH value of 2.5 where silicon oxide particles with a diameter of approximately 30 nanometers are dispersed in a pure water. A rotational speed of a polishing pad is maintained at 50 times/min. A rotational speed of a polishing head is also maintained at 50 times/min. The polishing agent is added at a rate of 75 cc/min. The polishing rate is approximately 0.4 micrometers/min.

Figure 3K:
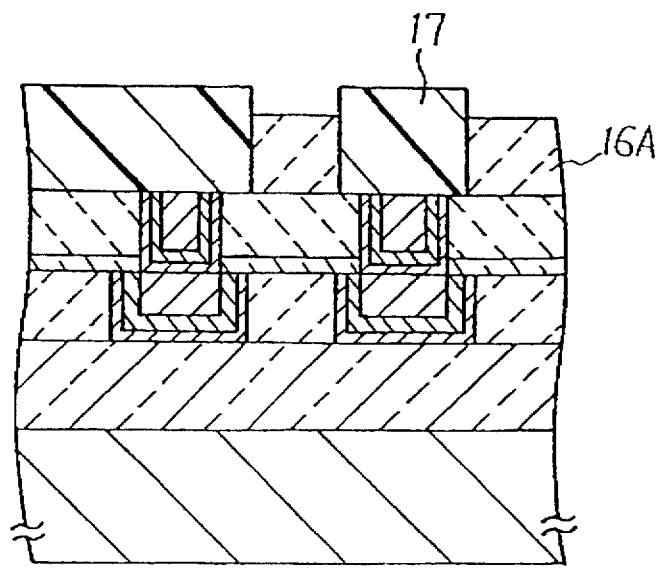

As illustrated in FIG. 3K, a third photo-resist film is applied on an entire surface of the device and then patterned to selectively form a third photo-resist pattern 17. A third fluoro-containing silicon oxide film 16A with a thickness of 0.8 micrometers is grown on the second fluoro-containing silicon oxide film by using the third photo-resist pattern 17 as a mask. The growth of the fluoro-containing silicon oxide film 16A is achieved by a liquid phase growth which uses a super-saturated hydrosilicofluoric acid solution, wherein the hydrosilicofluoric acid in the solution is maintained in super-saturated state by immersing and dissolving an aluminum piece in an aqueous solution which includes a hydrosilicofluoric acid at a concentration of about 40% by weight. The reactions of hydrosilicofluoric acid with aluminum are expressed by the foregoing formulae (1) and (2). The reactions of hydrosilicofluoric acid with aluminum, which are expressed by the above formulae (1) and (2), are caused by adding aluminum into the hydrosilicofluoric acid solution. The chemical equilibrium expressed in the left hand term is broken, thereby resulting in an extraction of fluoro-containing silicon oxide so that the third fluoro-containing silicon oxide film 16A, which has Si-F bonding, is deposited. During the deposition of the fluoro-containing silicon oxide film 16A, the hydrosilicofluoric acid solution is maintained at a temperature of 35° C. so that the solubility of aluminum to 1 liter of hydrosilicofluoric acid solution is set at approximately 0.5 g/hour, thereby resulting in a fluoro-containing silicon oxide film deposition rate being in the range of 80 nanometers to 100 nanometers.

Figure 3L:
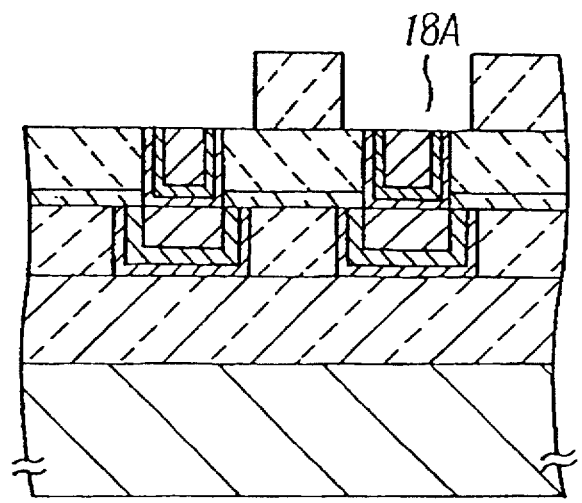

As illustrated in FIG. 3L, the third photo-resist pattern 17, having apertures within which the fluoro-containing silicon oxide film 12 is formed, is removed by a peeling liquid so that third interconnection grooves 1 8A are formed in the third fluoro-containing silicon oxide film 16A.

Figure 3M:
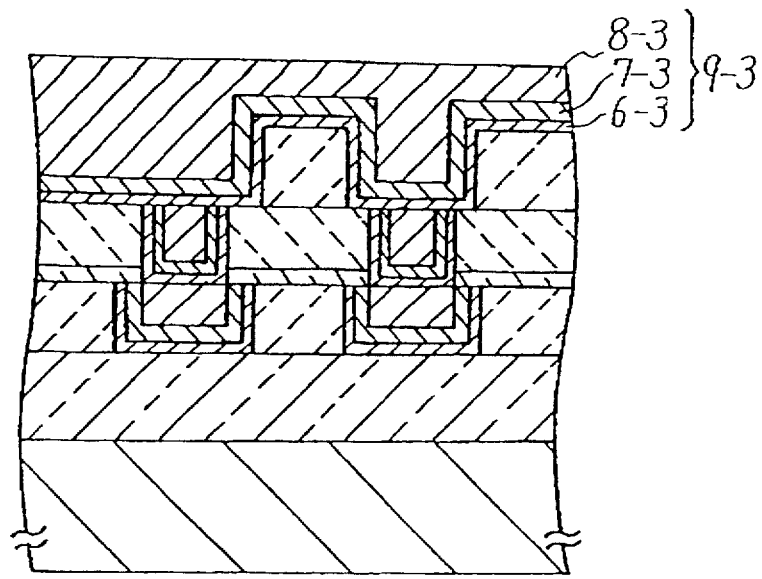

As illustrated in FIG. 3M, a titanium film 6-3 with a thickness of 50 nanometers is deposited on an entire surface of the device by a sputtering method. A titanium nitride film 7-3 with a thickness of 100 nanometers is deposited on the titanium film 6-3 by a sputtering method. An aluminum film 8-3 with a thickness of approximately 0.7 micrometers is formed on the titanium nitride film 7-3 by a thermal chemical vapor phase deposition, wherein dimethylalminumhydride $AlH(CH_3)_2$ is vaporized by a bubbling method with a carrier gas of hydrogen at a temperature of 30° C. and then introduced into a reaction chamber. The flow rate of hydrogen gas used in the bubbling method is controlled at 250 sccm. The pressure of the reaction chamber is maintained at 130 Pa. The temperature of the substrate is maintained at 250° C. The deposition rate of aluminum is approximately 0.4 micrometers/min.

Figure 3N:
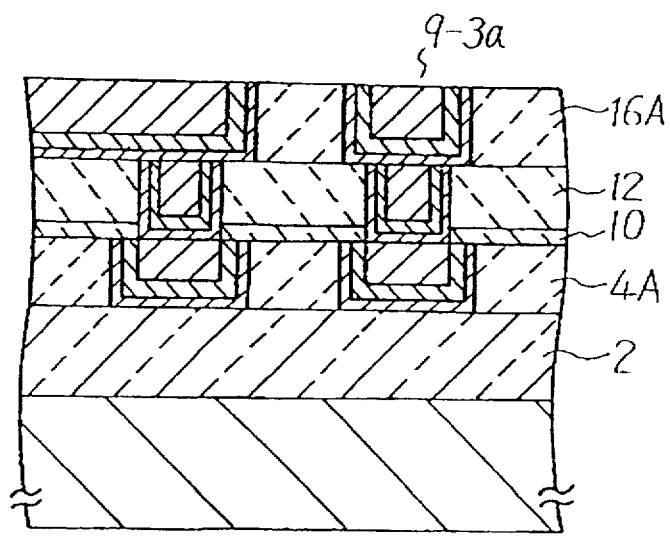

As illustrated in FIG. 3N, the aluminum film 8-3, the titanium nitride film 7-3 and the titanium film 6-3 are selectively removed by a chemical/mechanical polishing to leave the aluminum film 8-3, the titanium nitride film 7-3 and the titanium film 6-3 only within the third interconnection grooves 18A. As a result, the second interconnections 9-3a, each of which comprises the aluminum film 8-3, the titanium nitride film 7-3 and the titanium film 6-3, are formed in the second interconnection grooves 5A. The polishing is carried out by using an acid polishing agent with apH value of 2.5 where silicon oxide particles with a diameter of approximately 30 nanometers are dispersed in a pure water. A rotational speed of a polishing pad is maintained at 50 times/min. A rotational speed of a polishing head is also maintained at 50 times/min. The polishing agent is added at a rate of 75 cc/min. The polishing rate is approximately 0.4 micrometers/min.

The two level interconnection structure is fabricated. The surface of the inter-layer insulator between the two level interconnection layers are leveled. A sample is formed by use of the above technique, wherein ten thousand via holes are connected in series to each other. A diameter of the via holes is 0.6 micrometers. Each via hole has a resistance of approximately 0.3 Ω. The yield is 95%.

According to the above method, the silicon oxide base film is formed to cover the first interconnections before the surface of the device is exposed to the super-saturated hydrosilicofluoric acid solution so that the first interconnections are free from any corrosion caused by the super-saturated hydrosilicofluoric acid solution. The conductive film within the via holes are also free from any corrosion caused by the super-saturated hydrosilicofluoric acid solution as being covered with the photo-resist film. The combination of the chemical/mechanical polishing and subsequent liquid phase growth allows the inter-layer insulator to have a level surface.

A second embodiment according to the present invention will be described with reference to FIGS. 4A–4J, wherein a novel method for forming multilevel interconnections in a semiconductor device is provided.

Figure 4A:
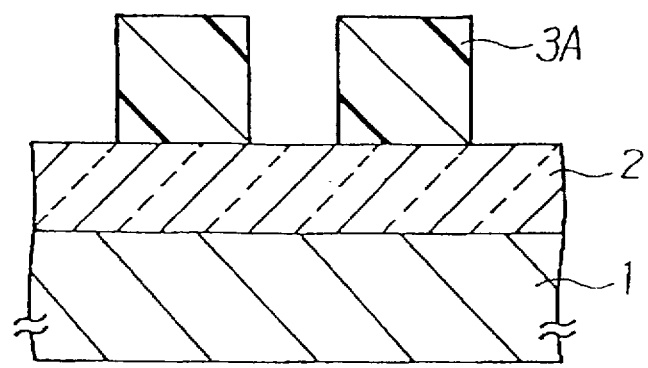
FIGS. 4A–4J are cross sectional elevation views illustrative of a semiconductor device with multilevel interconnections involved in a novel fabrication method in a second embodiment according to the present invention.

As illustrated in FIG. 4A, a first insulating film 2, being made of silicon oxide and having a thickness of 1 micrometer, is formed as a first insulator on a silicon substrate 1 by a plasma chemical vapor deposition method. A photo-resist is applied on the silicon oxide film 2 and then patterned by photo-lithography to form a photo-resist pattern 3A on the first insulating film 2.

Figure 4B:
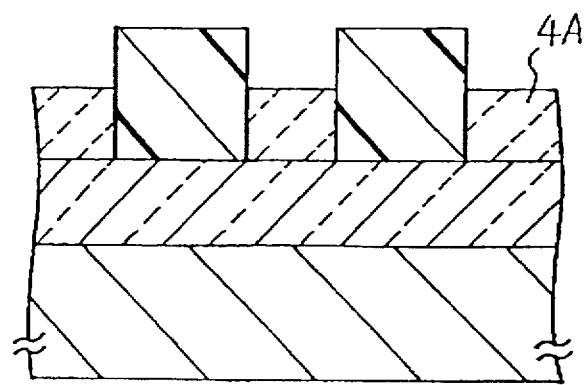

As illustrated in FIG. 4B, a second insulating film 4A, being made of fluoro-containing silicon oxide and having a thickness of 0.8 micrometers, is grown on the first insulating film 2 by using the photo-resist pattern 3A as a mask. The growth of the fluoro-containing silicon oxide film 4A is achieved by a liquid phase growth which uses a super-saturated hydrosilicofluoric acid solution, wherein the hydrosilicofluoric acid in the solution is maintained in super-saturated state by immersing and dissolving an aluminum piece in an aqueous solution which includes a hydrosilicofluoric acid at a concentration of about 40% by weight. The reaction of hydrosilicofluoric acid with aluminum is expressed by the following formulae.

$$H_2SiF_6+2H_2O \rightarrow 6HF+SiO_2 \qquad (1)$$

$$Al^{3+}+3HF \rightarrow AlF_3+3H^+ \qquad (2)$$

The above matter is disclosed in the Japanese laid-open patent application No. 62-20876. The reaction of hydrosilicofluoric acid with aluminum, which is expressed by the above formula (1) and (2), is caused by adding aluminum into the hydrosilicofluoric acid solution. The chemical equilibrium expressed in the left hand term is broken, thereby resulting in an extraction of fluoro-containing silicon oxide so that the fluoro-containing silicon oxide film 4A, which has Si-F bonding, is deposited on the silicon oxide film 2. During the deposition of the fluoro-containing silicon oxide film 4A, the hydrosilicofluoric acid solution is maintained at a temperature of 35° C. so that the solubility of aluminum to 1 liter of hydrosilicofluoric acid solution is set at approximately 0.5 g/hour, thereby resulting in a fluoro-containing silicon oxide film deposition rate being in the range of 80 nanometers to 100 nanometers.

Figure 4C:
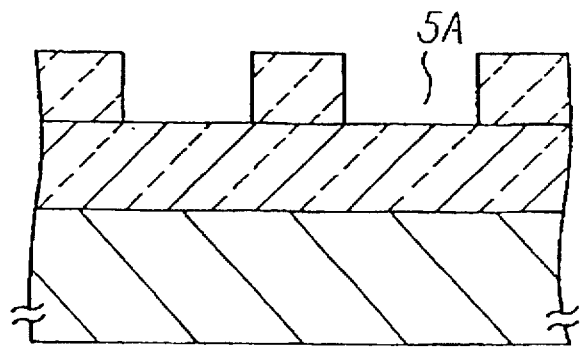

As illustrated in FIG. 4C, only the first photo-resist pattern 3A having apertures, within which the fluoro-containing silicon oxide film 4A is formed, is removed by a peeling liquid so that first interconnection grooves 5A defined by the fluoro-containing silicon oxide film 4A are formed.

Figure 4D:
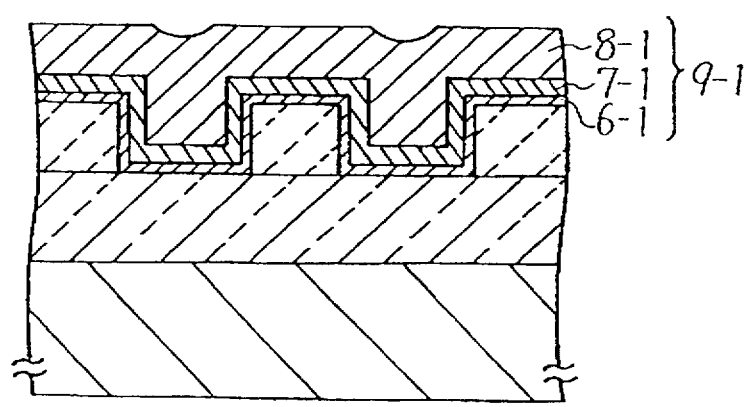

As illustrated in FIG. 4D, the substrate is introduced into a sputtering apparatus and then a vacuum of $1 \times 10^{-5}$ Pa is created. The substrate is subjected to an etching using an argon gas with a pressure of 0.7 Pa to remove a spontaneous oxide film from the surface of the substrate. A titanium film 6-1 with a thickness of approximately 50 nanometers is deposited on an entire surface of the device by a sputtering method. A titanium nitride film 7-1 with a thickness of approximately 100 nanometers is deposited on the titanium film 6-1 by a sputtering method. An aluminum film 8-1 with a thickness of 700 nanometers is formed on the titanium nitride film 7-1 by a chemical vapor deposition, wherein dimethylalminumlhydride $AlH(CH_3)_2$ is vaporized by a bubbling method with a carrier gas of hydrogen at a temperature of 30° C. and then introduced into a reaction chamber. The flow rate of hydrogen gas used in the bubbling method is controlled at 250 sccm. The pressure of the reaction chamber is maintained at 130 Pa. The temperature of the substrate is maintained at 250° C. The deposition rate of aluminum is approximately 0.4 micrometers/min.

Figure 4E:
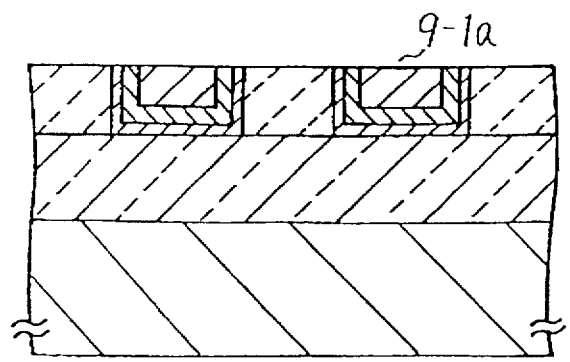

As illustrated in FIG. 4E, the aluminum film 8-1, the titanium nitride film 7-1 and the titanium film 6-1 are selectively removed by a chemical/mechanical polishing to leave the aluminum film 8-1, the titanium nitride film 7-1 and the titanium film 6-1 only within the first interconnection grooves 5A. As a result, the first interconnections, each of which comprises the aluminum film 8-1, the titanium nitride film 7-1 and the titanium film 6-1, are formed in the first interconnection grooves 5A. The polishing is carried out by using an acid polishing agent with a pH value of 2.5 where silicon oxide particles with a diameter of approximately 30 nanometers are dispersed in a pure water. A rotational speed of a polishing pad is maintained at 50 times/min. A rotational speed of a polishing head is also maintained at 50 times/min. The polishing agent is added at a rate of 75 cc/min. The polishing rate is approximately 0.4 micrometers/min.

Figure 4F:
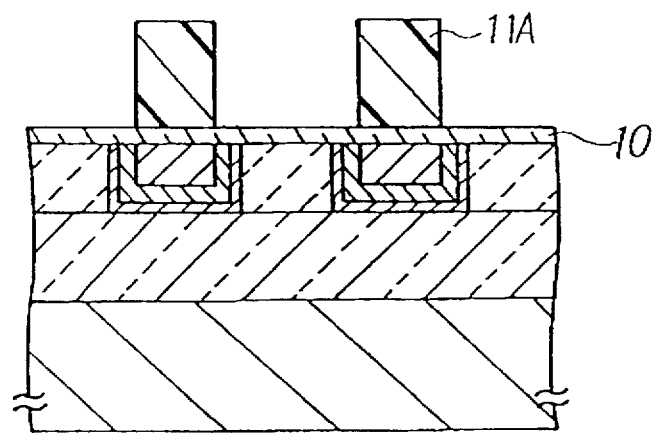

As illustrated in FIG. 4F, a silicon oxide base film 10 with a thickness of approximately 100 nanometers is formed on an entire surface of the device by a plasma chemical vapor deposition. A second photo-resist film is applied on an entire surface of the silicon oxide base film 10 and then patterned to form a second photo-resist pattern 1 1A which positioned over the aluminum film 8-1 within the first interconnection grooves.

Figure 4G:
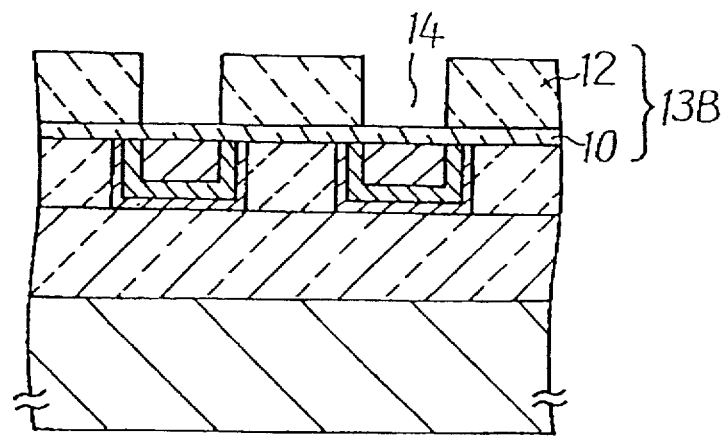

As illustrated in FIG. 4G, a second fluoro-containing silicon oxide film 12 with a thickness of 0.8 micrometers is grown on the silicon oxide base film 10 by using the second photo-resist pattern 1 1A as a mask. The growth of the fluoro-containing silicon oxide film 12 is achieved by a liquid phase growth which uses a super-saturated hydrosilicofluoric acid solution, wherein the hydrosilicofluoric acid in the solution is maintained in supersaturated state by immersing and dissolving an aluminum piece in an aqueous solution which includes a hydrosilicofluoric acid at a concentration of about 40% by weight. The reaction of hydrosilicofluoric acid with aluminum is expressed by the foregoing formulae (1) and (2). The reactions of hydrosilicofluoric acid with aluminum, which are expressed by the above formulae (1) and (2), are caused by adding aluminum into the hydrosilicofluoric acid solution. The chemical equilibrium expressed in the left hand term is broken, thereby resulting in an extraction of flurocontaining silicon oxide so that the second fluoro-containing silicon oxide film 12, which has Si-F bonding, is deposited. During the deposition of the fluoro-containing silicon oxide film 12, the hydrosilicofluoric acid solution is maintained at a temperature of 35° C. so that the solubility of aluminum to 1 liter of hydrosilicofluoric acid solution is set at approximately 0.5 g/hour, thereby resulting in a fluoro-containing silicon oxide film deposition rate being in the range of 80 nanometers to 100 nanometers. The second photoresist pattern 1 A, having apertures within which the fluoro-containing silicon oxide film 12 is formed, is removed by a peeling liquid so that openings 14 are formed in the fluoro-containing silicon oxide film 12.

Figure 4H:
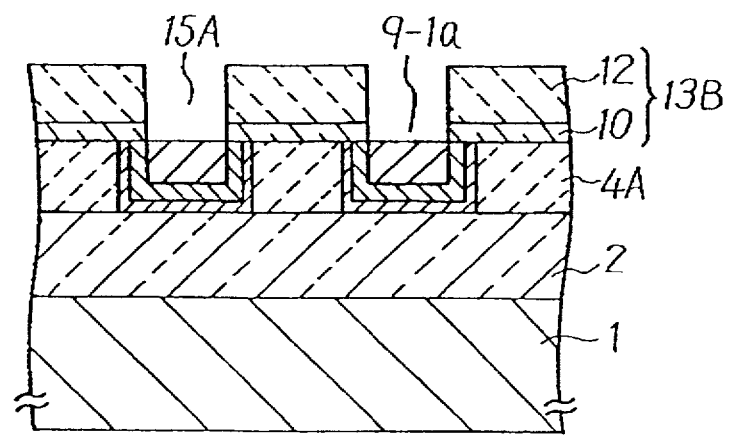

As illustrated in FIG. 4H, the silicon oxide base film 10 tinder the openings 14 is selectively removed by a reactive dry etching which uses $CF_4$ gas to form via holes 15A over the titanium films 8-1 within the first interconnection grooves 5A. The reactive dry etching is carried out by using a parallel plate type apparatus usable for batch treatments. The flow rate of $CF_4$ gas is maintained at 100 sccm. The pressure of the reaction chamber is set at 10 Pa. The substrate temperature is maintained at 20° C. A power of 1 kW with a frequency of 13.56 MHz is applied. The etching rate of approximately 40 nanometers/min. is obtained. By the etch back process, the thickness of the fluoro-containing silicon oxide film 12 is reduced to approximately 0.65 micrometers. The fluoro-containing silicon oxide film 12 and the silicon oxide base film 10 constitute a third insulator 13B.

Figure 4I:
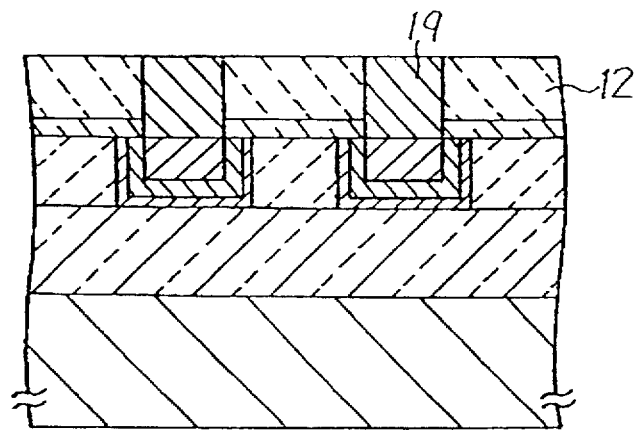

As illustrated in FIG. 4I, a tungsten film 19 with a thickness of approximately 0.8 micrometers is selectively formed within the via holes 51 A by a heat chemical vapor phase growth, in which $WF_6$ gas and $SiH_4$ gas are used. The respective flow rates of $WF_6$ gas and $SiH_4$ gas are set at 20 sccm and 12 sccm. The substrate temperature is maintained at 270° C. The pressure of the reaction chamber is set at 4 Pa. The deposition rate is 0.6 micrometers/min.

Figure 4J:
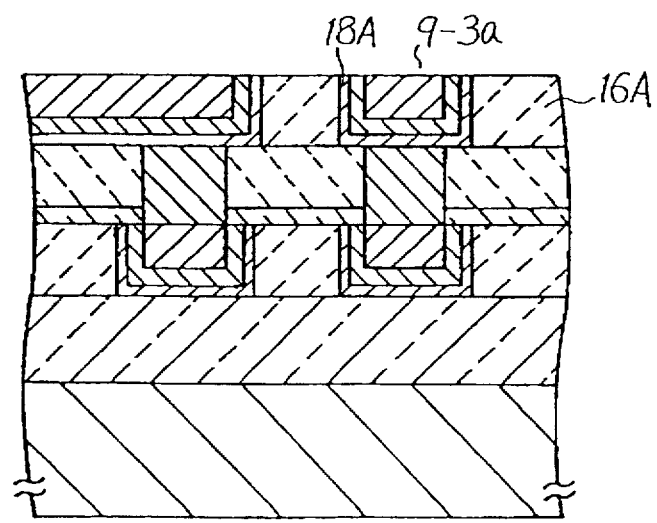

As illustrated in FIG. 4J, a third photo-resist film is applied on all entire surface of the device and then patterned to selectively form a third photo-resist pattern, which is not illustrated and covers the tungsten film 19. A third fluoro-containing silicon oxide film 16A with a thickness of 0.8 micrometers is grown only the third fluoro-containing silicon oxide film by using the third photo-resist pattern as a mask. The growth of the fluoro-containing silicon oxide film 16A is achieved by a liquid phase growth which uses a super-saturated hydrosilicofluoric acid solution, wherein the hydrosilicofluoric acid in the solution is maintained in super-saturated state by immersing and dissolving an aluminum piece in an aqueous solution which includes a hydrosilicofluoric acid at a concentration of about 40% by weight. The reactions of hydrosilicofluoric acid with aluminum are expressed by the foregoing formulae (1) and (2). The reactions of hydrosilicofluoric acid with aluminum, which are expressed by the above formulae (1) and (2), are caused by adding aluminum into the hydrosilicofluoric acid solution. The chemical equilibrium expressed in the left hand term is broken, thereby resulting in an extraction of fluoro-containing silicon oxide so that the third fluoro-containing silicon oxide film 16A, which has Si-F bonding, is deposited. During the deposition of the fluoro-containing silicon oxide film 16A, the hydrosilicofluoric acid solution is maintained at a temperature of 35° C. so that the solubility of aluminum to 1 liter of hydrosilicofluoric acid solution is set at approximately 0.5 g/hour, thereby resulting in a fluoro-containing silicon oxide film deposition rate being in the range of 80 nanometers to 100 nanometers.

Subsequently, the third photo-resist pattern 17, having apertures within which the fluoro-containing silicon oxide film 12 is formed, is removed by a peeling liquid so that third interconnection grooves 1 8A are formed in the third fluoro-containing silicon oxide film 1 6A.

A titanium film 6-3 with a thickness of 50 nanometers is deposited on an entire surface of the device by a sputtering method. A titanium nitride film 7-3 with a thickness of 100 nanometers is deposited on the titanium film 6-3 by a sputtering method. An aluminum film 8-3 with a thickness of approximately 0.7 micrometers is formed on the titanium nitride film 7-3 by a thermal chemical vapor phase deposition, wherein dimetlhylalminumhlydride AlH(CH$_3$)$_2$ is vaporized by a bubbling method with a carrier gas of hydrogen at a temperature of 30° C. and then introduced into a reaction chamber. The flow rate of hydrogen gas used in the bubbling method is controlled at 250 sccm. The pressure of the reaction chamber is maintained at 130 Pa. The temperature of the substrate is maintained at 250° C. The deposition rate of aluminum is approximately 0.4 micrometers/min.

The aluminum film 8-3, the titanium nitride film 7-3 and the titanium film 6-3 are selectively removed by a chemical/mechanical polishing to leave the aluminum film 8-3, the titanium nitride film 7-3 and the titanium in film 6-3 only within the third interconnection grooves 18A. As a result, the second interconnections 9-3$a$, each of which comprises the aluminum film 8-3, the titanium nitride film 7-3 and the titanium film 6-3, are formed in the second interconnection grooves 5A. The polishing is carried out by using an acid polishing agent with a pH value of 2.5 where silicon oxide particles with a diameter of approximately 30 nanometers are dispersed in a pure water. A rotational speed of a polishing pad is maintained at 50 times/min. A rotational speed of a polishing head is also maintained at 50 times/min. The polishing agent is added at a rate of 75 cc/min. The polishing rate is approximately 0.4 micrometers/min.

The two level interconnection structure is fabricated. The surface of the inter-layer insulator between the two level interconnection layers are leveled. A sample is formed by use of the above technique, wherein ten thousand via holes are connected in series to each other. A diameter of the via holes is 0.6 micrometers. Each via hole has a resistance of approximately 0.8 Ω. The yield is over 93%.

According to the above method, the silicon oxide base film is formed to cover the first interconnections before the surface of the device is exposed to the super-saturated hydrosilicofluoric acid solution so that the first interconnections are free from any corrosion caused by the super-saturated hydrosilicofluoric acid solution. The tungsten film within the via holes are also free from any corrosion caused by the super-saturated hydrosilicofluoric acid solution as being covered with the photo-resist film. The combination of the chemical/mechanical polishing and subsequent liquid phase growth allows the inter-layer insulator to have a level surface.

A third embodiment according to the present invention will be described with reference to FIGS. 5A–5K, wherein a novel method for forming multilevel interconnections in a semiconductor device is provided.

Figure 5A:
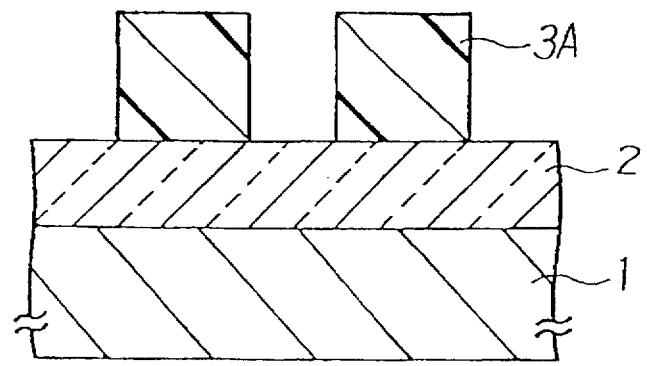
FIGS. 5A–5K are cross sectional elevation views illustrative of a semiconductor device with multilevel interconnections involved in a novel fabrication method in a third embodiment according to the present invention.

As illustrated in FIG. 5A, a first insulating film 2, being made of silicon oxide and having a thickness of 1 micrometer, is formed as a first insulator on a silicon substrate 1 by a plasma chemical vapor deposition method. A photo-resist is applied on the silicon oxide film 2 and then patterned by photo-lithography to form a photo-resist pattern 3A on the first insulating film 2.

Figure 5B:
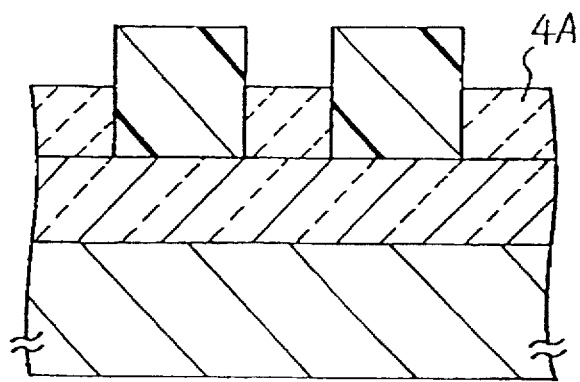

As illustrated in FIG. 5B, a second insulating film 4A, being made of fluoro-containing silicon oxide and having a thickness of 0.8 micrometers, is grown on the first insulating film 2 by using the photo-resist pattern 3A as a mask. The growth of the fluoro-containing silicon oxide film 4A is achieved by a liquid phase growth which uses a super-saturated hydrosilicofluoric acid solution, wherein the hydrosilicofluoric acid in the solution is maintained in super-saturated state by immersing and dissolving an aluminum piece in an aqueous solution which includes a hydrosilicofluoric acid at a concentration of about 40% by weight. The reaction of hydrosilicofluoric acid with aluminum is expressed by the following formulae.

$$H_2SiF_6 + 2H_2O \rightarrow 6HF + ISO_2 \qquad (1)$$

$$Al^{3+} + 3HF \rightarrow AlF_3 + 3H^+ \qquad (2)$$

The above matter is disclosed in the Japanese laid-open patent application No. 62-20876. The reaction of hydrosilicofluoric acid with aluminum, which is expressed by the above formulae (1) and (2), is caused by adding aluminum into the hydrosilicofluoric acid solution. The chemical equilibrium expressed in the left hand term is broken, thereby resulting in an extraction of fluoro-containing silicon oxide so that the fluoro-containing silicon oxide film 4A, which has Si-F bonding, is deposited on the silicon oxide film 2. During the deposition of the fluoro-containing silicon oxide film 4A, the hydrosilicofluoric acid solution is maintained at a temperature of 35° C. so that the solubility of aluminum to 1 liter of hydrosilicofluoric acid solution is set at approximately 0.5 g/hour, thereby resulting in a fluoro-containing silicon oxide film deposition rate being in the range of 80 nanometers to 100 nanometers.

Figure 5C:
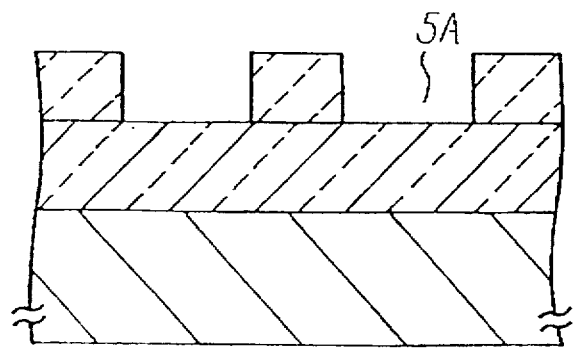

As illustrated in FIG. 5C, only the first photo-resist pattern 3A having apertures, within which the fluoro-containing silicon oxide film 4A is formed, is removed by a peeling liquid so that first interconnection grooves 5A defined by the fluoro-containing silicon oxide film 4A are formed.

Figure 5D:
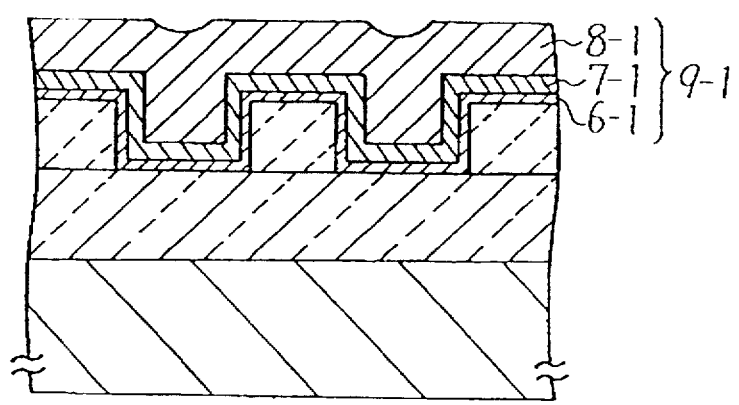

As illustrated in FIG. 5D, the substrate is introduced into a sputtering apparatus and then a vacuum of 1×10$^{-5}$ Pa is created. The substrate is subjected to an etching using an argon gas with a pressure of 0.7 Pa to remove a spontaneous oxide film from the surface of the substrate. A titanium film 6-1 with a thickness of approximately 50 nanometers is deposited on an entire surface of the device by a sputtering method. A titanium nitride film 7-1 with a thickness of approximately 100 nanometers is deposited on the titanium film 6-1 by a sputtering method. An aluminum film 8-1 with a thickness of 700 nanometers is formed on the titanium nitride film 7-1 by a chemical vapor deposition, wherein dimetlhylalminumlhydride AlH(CH$_3$)$_2$ is vaporized by a hubbling method with a carrier gas of hydrogen at a temperature of 30° C. and then introduced into a reaction chamber. The flow rate of hydrogen gas used in the bubbling method is controlled at 250 scm. The pressure of the reaction chamber is maintained at 130 Pa. The temperature of the substrate is maintained at 250° C. The deposition rate of aluminum is approximately 0.4 micrometers/min.

Figure 5E:
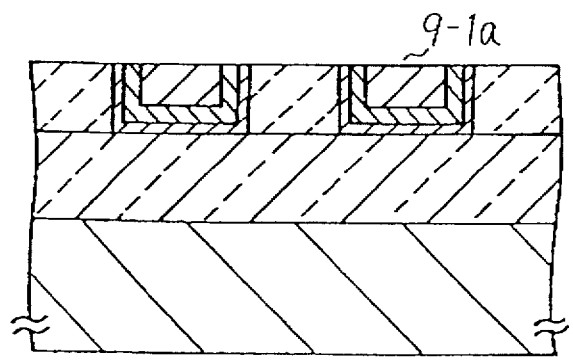

As illustrated in FIG. 5E, the aluminum film 8-1, the titanium nitride film 7-1 and the titanium film 6-1 are selectively removed by a chemical/mechanical polishing to leave the aluminum film 8-1, the titanium nitride film 7-1 and the titanium film 6-1 only within the first interconnection grooves 5A. As a result, the first interconnections, each of which comprises the aluminum film 8-1, the titanium nitride film 7-1 and the titanium film 6-1, are formed in the first interconnection grooves 5A. The polishing is carried out by using an acid polishing agent with a pH value of 2.5 where silicon oxide particles with a diameter of approximately 30 nanometers are dispersed in a pure water. A rotational speed of a polishing pad is maintained at 50 times/min. A rotational speed of a polishing head is also maintained at 50 times/min. The polishing agent is added at a rate of 75 cc/min. The polishing rate is approximately 0.4 micrometers/min.

Figure 5F:
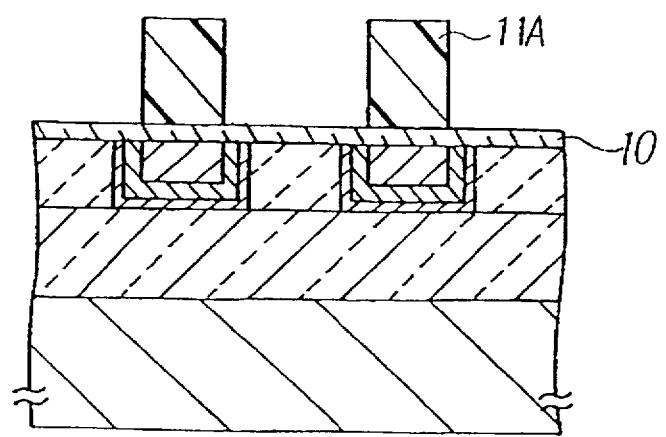

As illustrated in FIG. 5F, a second photo-resist film is applied on an entire surface of the silicon oxide base film 10 and then patterned to form a second photo-resist pattern 11A which positioned over the aluminum film 8-1 within the first interconnection grooves.

Figure 5G:
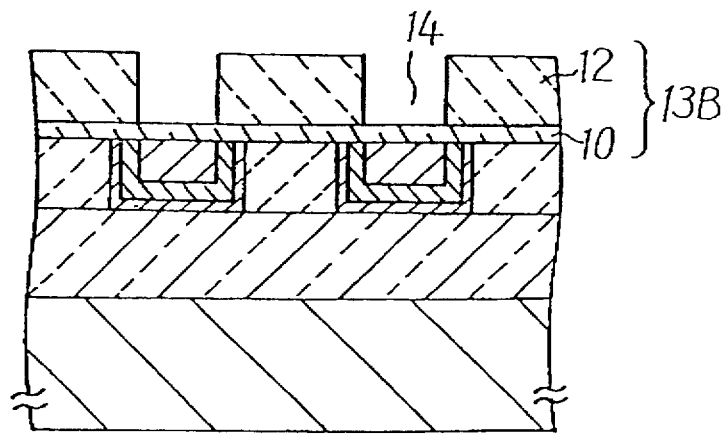

As illustrated in FIG. 5G, a second fluoro-containing silicon oxide film 12 with a thickness of 0.8 micrometers is grown on the silicon oxide base film 10 by using the second photo-resist pattern 1 1A as a mask. The growth of the fluoro-containing silicon oxide film 12 is achieved by a liquid phase growth which uses a super-saturated hydrosilicofluoric acid solution, wherein the hydrosilicofluoric acid in the solution is maintained in supersaturated state by immersing and dissolving an aluminum piece in an aqueous solution which includes a hydrosilicofluoric acid at a concentration of about 40% by weight. The reaction of hydrosilicofluoric acid with aluminum is expressed by the foregoing formulae (1) and (2). The reactions of hydrosilicofluoric acid with aluminum, which are expressed by the above formulae (1) and (2), are caused by adding aluminum into the hydrosilicofluoric acid solution. The chemical equilibrium expressed in the left hand term is broken, thereby resulting in an extraction of fluoro containing silicon oxide so that the second fluoro-containing silicon oxide film 12, which has Si-F bonding, is deposited. During the deposition of the fluoro-containing silicon oxide film 11, the hydrosilicofluoric acid solution is maintained at a temperature of 35° C. so that the solubility of aluminum to 1 liter of hydrosilicofluoric acid solution is set at approximately 0.5 g/hour, thereby resulting in a fluoro-containing silicon oxide film deposition rate being in the range of 80 nanometers to 100 nanometers. The second photo-resist pattern 11 A, having apertures within which the fluoro-containing silicon oxide film 12 is formed, is removed by a peeling liquid so that openings 14 are formed in the fluoro-containing silicon oxide film 12.

Figure 5H:
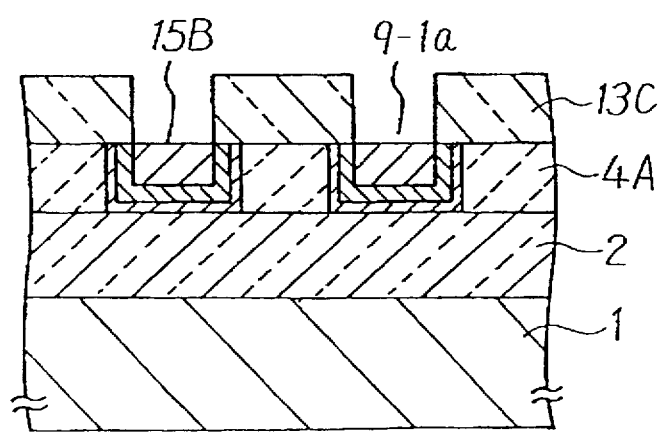

As illustrated in FIG. 5H, a silicon oxide film 13C with a thickness of 0.8 micrometers is formed on an entire surface of the device by a plasma chemical vapor phase growth. Via holes 15B are formed in the silicon oxide film 13C by a photo-lithography and a subsequent selective reactive ion-etching which uses a $CHF_3$ gas.

Figure 5I:
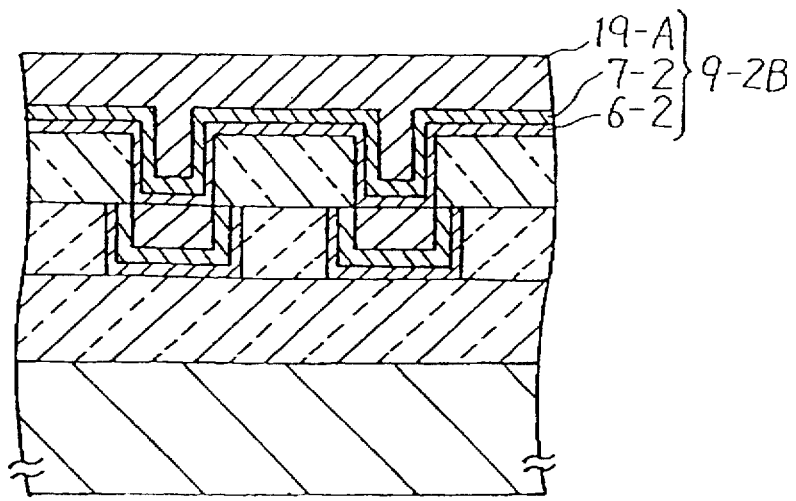

As illustrated in FIG. 5I, a titanium film 6-2 with a thickness of 50 nanometers is deposited on an entire surface of the device by a sputtering method. A titanium nitride film 7-2 with a thickness of 100 nanometers is deposited on the titanium film 6-2 by a sputtering method. A tungsten film 19A with a thickness of approximately 0.7 micrometers is formed on the titanium nitride film 7-2 by a thermal chemical vapor phase deposition. $WF_6$ gas and $H_2$ gas are used. The flow rates of $WF_6$ gas and $H_2$ gas are respectively controlled at 100 sccm and 1 slm. The pressure of the reaction chamber is maintained at 6600 Pa. The temperature of the substrate is maintained at 400° C. The deposition rate of tungsten is approximately 0.3 micrometers/min.

Figure 5J:
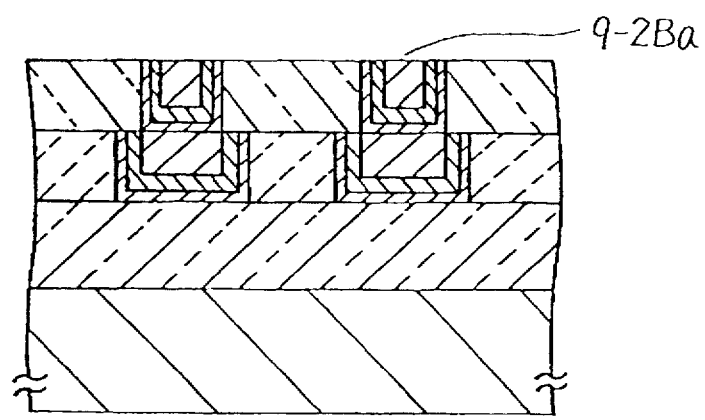

As illustrated in FIG. 5J, the tungsten film 19-A, the titanium nitride film 7-2 and the titanium film 6-2 are selectively removed by a chemical/mechanical polishing to leave the tungsten film 19-A, the titanium nitride film 7-2 and the titanium film 6-2 only within the via holes 15B. As a result, the conductive films, each of which comprises the tungsten film 19-A, the titanium nitride film 7-2 and the titanium film 6-2, are formed in the via holes 15B. The polishing is carried out by using an acid polishing agent with a pH value of 2.5 where silicon oxide particles with a diameter of approximately 30 nanometers are dispersed in a pure water. A rotational speed of a polishing pad is maintained at 50 times/min. A rotational speed of a polishing head is also maintained at 50 times/min. The polishing agent is added at a rate of 75 cc/min. The polishing rate is approximately 0.3 micrometers/min.

Figure 5K:
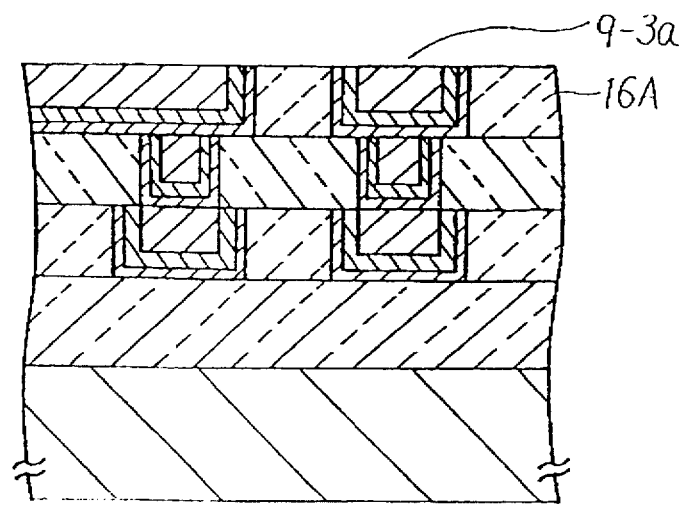

As illustrated in FIG. 5K, a third photo-resist film is applied on an entire surface of the device and then patterned to selectively form a third photo-resist pattern 17. A third fluoro-containing silicon oxide film 16A with a thickness of 0.8 micrometers is grown on the third fluoro-containing silicon oxide film by using the third photo-resist pattern 17 as a mask. The growth of the fluoro-containing silicon oxide film 16A is achieved by a liquid phase growth which c uses a super-saturated hydrosilicoflloric acid solution, wherein the hydrosilicofluoric acid in the solution is maintained in super-saturated state by immersing and dissolving an aluminum piece in an aqueous solution which includes a hydrosilicofluoric acid at a concentration of about 40% by weight. The reactions of hydrosilicofluoric acid with aluminum re expressed by the foregoing formulae (1) and (2). The reactions of hydrosilicofluoric acid with aluminum, which are expressed by the above formula (1) and (2), are caused by adding aluminum into the hydrosilicofluoric acid solution. The chemical equilibrium expressed in the left hand term is broken, thereby resulting in an extraction of fluoro containing silicon oxide so that the third fluoro-containing silicon oxide film 16A, which has Si-F bonding, is deposited. During the deposition of the fluoro-containing silicon oxide film 16A, the hydrosilicofluoric acid solution is maintained at a temperature of 35° C. so that the solubility of aluminum to 1 liter of hydrosilicofluoric acid solution is set at approximately 0.5 g/hour, thereby resulting in a fluoro-containing silicon oxide film deposition rate being in the range of 80 nanometers to 100 nanometers.

The third photo-resist pattern, having apertures within which the fluoro-containing silicon oxide film 12 is formed, is removed by a peeling liquid so that third interconnection grooves 18A are formed in the third fluoro-containing silicon oxide film 16A. A titanium film 6-3 with a thickness of 50 nanometers is deposited on an entire surface of the device by a sputtering method. A titanium nitride film 7-3 with a thickness of 100 nanometers is deposited on the titanium film 6-3 by a sputtering method. An aluminum film 8-3 with a thickness of approximately 0.7 micrometers is formed on the titanium nitride film 7-3 by a thermal chemical vapor phase deposition, wherein dimethylalminumthydride AlH $(CH_3)_2$ is vaporized by a bubbling method with a carrier gas of hydrogen at a temperature of 30° C. and then introduced into a reaction chamber. The flow rate of hydrogen gas used in the hubbling method is controlled at 250 sccm. The pressure of the reaction chamber is maintained at 130 Pa. The temperature of the substrate is maintained at 250° C. The deposition rate of aluminum is approximately 0.4 micrometers/min. The aluminum film 8-3, the titanium nitride film 7-3 and the titanium film 6-3 are selectively removed by a chemical/mechanlical polishing to leave the aluminum film 8-3, the titanium nitride film 7-3 and the titanium film 6-3 only within the third interconnection grooves 18A. As a result, the second interconnections 9-3a, each of which comprises the aluminum film 8-3, the titanium nitride film 7-3 and the titanium film 6-3, are formed in the second interconnection grooves 5A. The polishing is carried out by using an acid polishing agent with a pH value of 2.5 where silicon oxide particles with a diameter of approximately 30 nanometers are dispersed in a pure water. A rotational speed of a polishing pad is maintained at 50 times/min. A rotational speed of a polishing head is also maintained at 50 times/min. The polishing agent is added at a rate of 75 cc/min. The polishing rate is approximately 0.4 micrometers/min.

The two level interconnection stricture is fabricated. The surface of the inter-layer insulator between tile two level interconnection layers are leveled. A sample is formed by use of the above technique, wherein ten thousand via holes are connected in series to each other. A diameter of the via holes is 0.6 micrometers. Each via hole has a resistance of approximately 0.7 Ω. The yield is 95%.

According to the above method, the silicon oxide base film is formed to cover the first interconnections before the surface of the device is exposed to the super-saturated hydrosilicofluoric acid solution so that tile first interconnections are free from any corrosion caused by the super-saturated hydrosilicofluoric acid solution. The conductive film within the via holes are also free from any corrosion caused by the super-saturated hydrosilicofluoric acid solution as being covered with the photo-resist film. The combination of the chemical/mechanical polishing and subsequent liquid phase growth allows the inter-layer insulator to have a level surface.

A fourth embodiment according to the present invention will be described with reference to FIGS. 6A–5H, wherein a novel method for forming multilevel interconnections in a semiconductor device is provided.

Figure 6A:
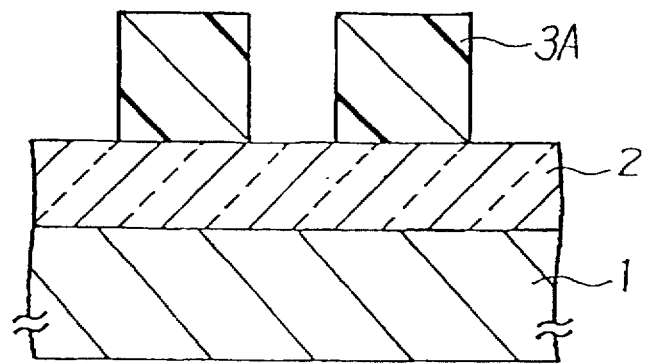
FIGS. 6A–6H are cross sectional elevation views illustrative of a semiconductor device with multilevel interconnections involved in a novel fabrication method in a fourth embodiment according to the present invention.

As illustrated in FIG. 6A, a first insulating film 2, being made of silicon oxide and having a thickness of 1 micrometer, is formed as a first insulator on a silicon substrate 1 by a plasma chemical vapor deposition method. A photo-resist is applied on the silicon oxide film 2 and then patterned by photo-lithography to form a photo-resist pattern 3A on the first insulating film 2.

Figure 6B:
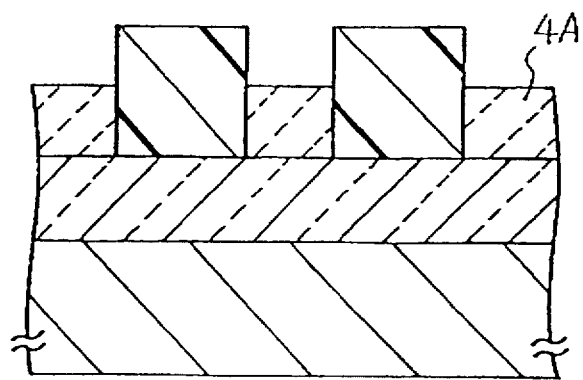

As illustrated in FIG. 6B, a second insulating film 4A, being made of fluoro-containing silicon oxide and having a thickness of 0.8 micrometers, is grown on the first insulating film 2 by using the photo-resist pattern 3A as a mask. The growth of the fluoro-containing silicon oxide film 4A is achieved by a liquid phase growth which uses a super-saturated hydrosilicofluoric acid solution, wherein the hydrosilicofluoric acid in the solution is maintained in super-saturated state by immersing and dissolving an aluminum piece in an aqueous solution which includes a hydrosilicofluoric acid at a concentration of about 40% by weight. The reaction of hydrosilicofluoric acid with aluminum is expressed by the following formulae.

The above matter is disclosed in the Japanese laid-open patent application No. 62-20876. The reaction of hydrosilicofluoric acid with aluminum, which is expressed by the above formula (1) and (2), is caused by adding aluminum into the hydrosilicofluoric acid solution. The chemical equilibrium expressed in the left hand term is broken, thereby resulting in an extraction of fluoro-containing silicon oxide so that the fluoro-containing silicon oxide film 4A, which has Si-F bonding, is deposited on the silicon oxide film 2. During the deposition of the fluoro-containing silicon oxide film 4A, the hydrosilicofluoric acid solution is maintained at a temperature of 35° C. so that the solubility of aluminum to 1 liter of hydrosilicofluoric acid solution is set at approximately 0.5 g/hour, thereby resulting in a fluoro-containing silicon oxide film deposition rate being in the range of 80 nanometers to 100 nanometers.

Figure 6C:
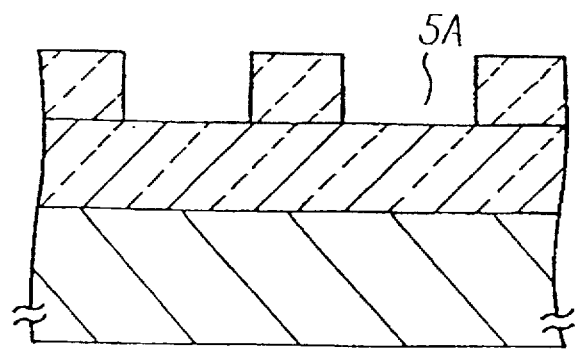

As illustrated in FIG. 6C, only the first photo-resist pattern 3A having apertures, within which the fluoro-containing silicon oxide film 4A is formed, is removed by a peeling liquid so that first interconnection grooves 5A defined by the fluoro-containing silicon oxide film 4A are formed.

Figure 6D:
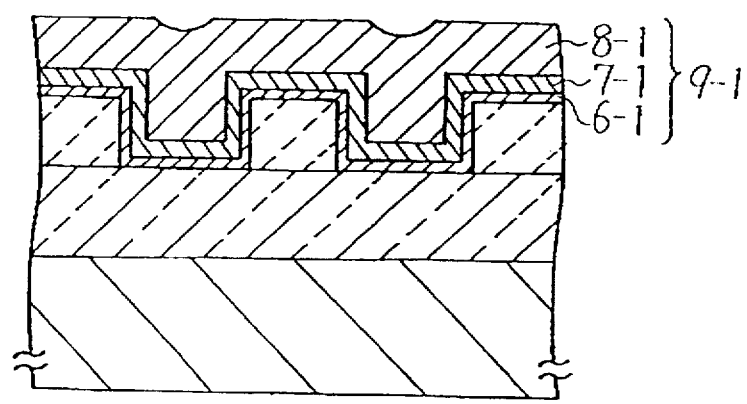

As illustrated in FIG. 6D, the substrate is introduced into a sputtering apparatus and then a vacuum of $1 \times 10^{-5}$ Pa is created. The substrate is subjected to an etching using an argon gas with a pressure of 0.7 Pa to remove a spontaneous oxide film from the surface of the substrate. A titanium film 6-1 with a thickness of approximately 50 nanometers is deposited on an entire surface of the device by a sputtering method. A titanium nitride film 7-1 with a thickness of approximately 100 nanometers is deposited on the titanium film 6-1 by a sputtering method. An aluminum film 8-1 with a thickness of 700 nanometers is formed on the titanium nitride film 7-1 by a chemical vapor deposition, wherein dimethylalminumnhydride $AlH(CH_3)_2$ is vaporized by a bubbling method with a carrier gas of hydrogen at a temperature of 30° C. and then introduced into a reaction chamber. The flow rate of hydrogen gas used in the bubbling method is controlled at 250 sccm. The pressure of the reaction chamber is maintained at 130 Pa. The temperature of the substrate is maintained at 250° C. The deposition rate of aluminum is approximately 0.4 micrometers/min.

Figure 6E:
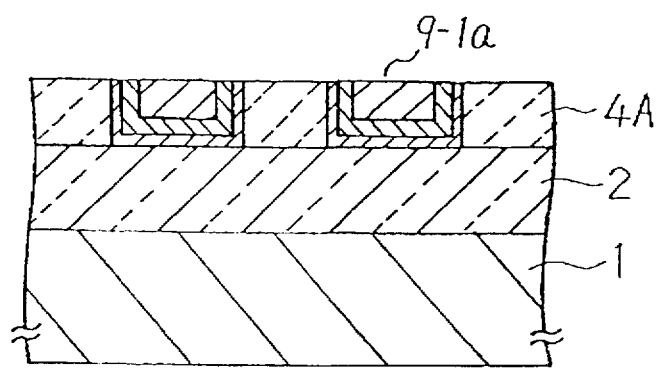

As illustrated in FIG. 6E, the aluminum film 8-1, the titanium nitride film 7-1 and the titanium film 6-1 are selectively removed by a chemical/mechanical polishing to leave the aluminum film 8-1, the titanium nitride film 7-1 and the titanium film 6-1 only within the first interconnection grooves 5A. As a result, the first interconnections, each of which comprises the aluminum film 8-1, the titanium nitride film 7-1 and the titanium film 6-1, are formed in the first interconnection grooves 5A. The polishing is carried out by using an acid polishing agent with a pH value of 2.5 where silicon oxide particles with a diameter of approximately 30 nanometers are dispersed in a pure water. A rotational speed of a polishing pad is maintained at 50 times/min. A rotational speed of a polishing head is also maintained at 50 times/min. The polishing agent is added at a rate of 75 cc/min. The polishing rate is approximately 0.4 micrometers/min.

Figure 6F:
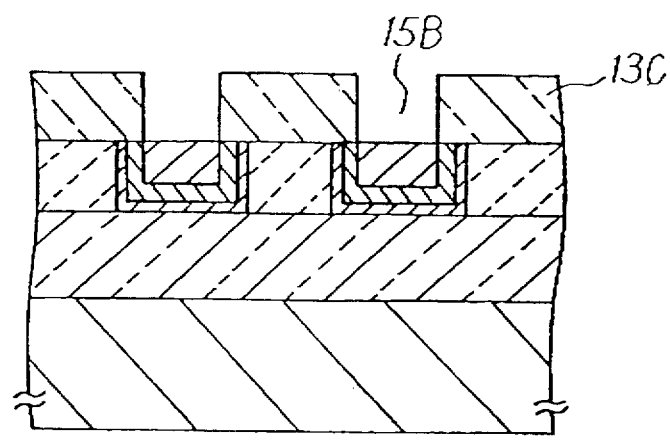

As illustrated in FIG. 6F, a second photo-resist film, which is not illustrated, is applied on an entire surface of the device and then patterned to form a second photo-resist pattern which is not illustrated and positioned over the aluminum film 8-1 within the first interconnection grooves. An inter-layer insulator 13C with a thickness of 0.8 micrometers is formed by using a plasma chemical vapor deposition method where the second photo-resist pattern is used as a mask. The second photo-resist pattern, having apertures within which the fluoro-containing silicon oxide film 13C is formed, is removed by a peeling liquid so that via holes 15B are formed in the fluoro-containing silicon oxide film 12.

Figure 6G:
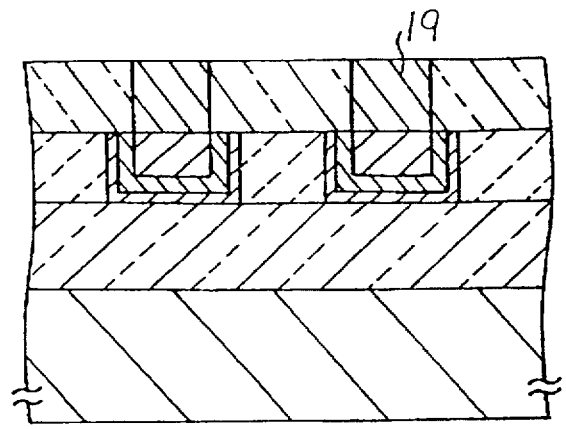

As illustrated in FIG. 6G, a tungsten film 19 with a thickness of approximately 0.8 micrometers is selectively formed within the via holes 51 B by a heat chemical vapor phase growth, in which $WF_6$ gas and $SiH_4$ gas are used. The respective flow rates of $WF_6$ gas and $SiH_4$ gas are set at 20 sccm and 12 sccm. The substrate temperature is maintained at 270° C. The pressure of the reaction chamber is set at 4 Pa. The deposition rate is 0.6 micrometers/min.

Figure 6H:
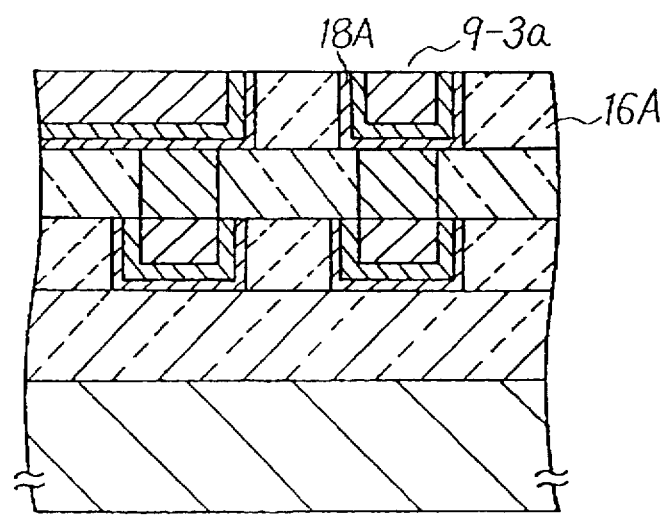

As illustrated in FIG. 6H, a third photo-resist film is applied on an entire surface of the device and then patterned to selectively form a third photo-resist pattern, which is not illustrated and covers the tungsten film 19. A third fluoro-containing silicon oxide film 16A with a thickness of 0.8 micrometers is grown on the third fluoro-containing silicon oxide film by using the third photo-resist pattern as a mask. The growth of the fluoro-containing silicon oxide film 16A is achieved by a liquid phase growth which uses a super-saturated hydrosilicofluoric acid solution, wherein the hydrosilicofluoric acid in the solution is maintained in super-saturated state by immersing and dissolving an aluminum piece in an aqueous solution which includes a hydrosilicofluoric acid at a concentration of about 40% by weight. The reactions of hydrosilicofluoric acid with aluminum are expressed by the foregoing formulae (1) and (2). The reactions of hydrosilicofluoric acid with aluminum, which are expressed by the above formulae (1) and (2), are caused by adding aluminum into the hydrosilicofluoric acid solution. The chemical equilibrium expressed in the left hand term is broken, thereby resulting in an extraction of fluoro-containing silicon oxide so that the third fluoro-containing silicon oxide film 16A, which has Si-F bonding, is deposited. During the deposition of the fluoro-containing silicon oxide film 16A, the hydrosilicofluoric acid solution is maintained at a temperature of 35° C. so that the solubility of aluminum to 1 liter of hydrosilicofluoric acid solution is set at approximately 0.5 g/hour, thereby resulting in a fluoro-containing silicon oxide film deposition rate being in the range of 80 nanometers to 100 nanometers.

Subsequently, the third photo-resist pattern, having apertures within which the fluoro-containing silicon oxide film 12 is formed, is removed by a peeling liquid so that third interconnection grooves 18A are formed in the third fluoro-containing silicon oxide film 16A.

A titanium film 6-3 with a thickness of 50 nanometers is deposited on an entire surface of the device by a sputtering method. A titanium nitride film 7-3 with a thickness of 100 nanometers is deposited on the titanium film 6-3 by a sputtering method. An aluminum film 8-3 with a thickness of approximately 0.7 micrometers is formed on the titanium nitride film 7-3 by a thermal chemical vapor phase deposition, wherein dimethylalminumlhydride AlH(CH$_3$)$_2$ is vaporized by a bubbling method with a carrier gas of hydrogen at a temperature of 30° C. and then introduced into a reaction chamber. The flow rate of hydrogen gas used in the bubbling method is controlled at 250 sccm. The pressure of the reaction chamber is maintained at 130 Pa. The temperature of the substrate is maintained at 250° C. The deposition rate of aluminum is approximately 0.4 micrometers/min.

The aluminum film 8-3, the titanium nitride film 7-3 and the titanium film 6-3 are selectively removed by a chemical/mechanical polishing to leave the aluminum film 8-3, the titanium nitride film 7-3 and the titanium film 6-3 only within the third interconnection grooves 18A. As a result, the second interconnections 9-3a, each of which comprises the aluminum film 8-3, the titanium nitride film 7-3 and the titanium film 6-3, are formed in the second interconnection grooves 5A. The polishing is carried out by using an acid polishing agent with a pH value of 2.5 where silicon oxide particles with a diameter of approximately 30 nanometers are dispersed in a pure water. A rotational speed of a polishing pad is maintained at 50 times/min. A rotational speed of a polishing head is also maintained at 50 times/min. The polishing agent is added at a rate of 75 cc/min. The polishing rate is approximately 0.4 micrometers/min.

The two level interconnection structure is fabricated. The surface of the inter-layer insulator between the two level interconnection layers are leveled. A sample is formed by use of the above technique, wherein tell thousand via holes are connected in series to each other. A diameter of the via holes is 0.6 micrometers. Each via hole has a resistance of approximately 0.8 Ω. The yield is over 93%.

According to the above method, the silicon oxide base film is formed to cover the first interconnections before the surface of the device is exposed to the super-saturated hydrosilicofluoric acid solution so that the first interconnections are free from any corrosion caused by the super-saturated hydro-silicofluoric acid solution. The tungsten film within the via holes are also free from any corrosion caused by the super-saturated hydrosilicofluoric acid solution as being covered with the photo-resist film. The combination of the chemical/mechanical polishing and subsequent liquid phase growth allows the inter-layer insulator to have a level surface. The inter-layer insulator is formed without any liquid phase growtlh, thereby the process for forming the inter-layer insulator is relatively simple.

The above novel method for forming the multilevel interconnections is applicable to three or more level interconnections. In place of the chemical/mechanical polishing method, an etch back process by a reactive ion-etching which uses a fluorine compound and/or a chlorine compound is also available. The silicon oxide film may contain at least one of phosphorus, boron and germanium. Such film may be formed by either a sputtering method or a chemical vapor deposition method. The interconnections may be made of a conductive material which includes at least one of titanium nitride, tungsten, molybdenum, gold, silver, copper, silicon, aluminum, titanium, titanium-conitainilig silicon. Such conductive film may be formed by a chemical vapor deposition method or a sputtering method.

The super-saturated hydrosilicofluoric acid solution may be prepared by heating a hydrosilicofluoric solution. The sniper-saturated hydrosilicofluoric acid solution may also be prepared by dissolving aluminum into a hydrosilicofluoric solution. The super-saturated hydro-silicofluoric acid solution may be prepared by adding either a boric acid solution or water into a hydrosilicofluoric solution.

As described above, the interconnection grooves are formed by a selective growth of the fluoro-containing silicon oxide film without using a reactive ion-etching process. This means that the interconnection grooves are free from any variation in its size due to any variation in the size of a photo-resist pattern.

When the inter-layer insulator is formed, the first interconnections which underlying the inter-layer insulator are not exposed to the super-saturated hydrosilicofluoric acid solution so that the first interconnections are free from any corrosion.

When the second fluoro-containing silicon oxide film which overlays the inter-layer insulator is formed, the conductive films in the via holes of the inter-layer insulator are not exposed to the super-saturated hydrosilicofluioric acid solution so that the conductive films are free from any corrosion.

The grooves and the via holes are filled with the conductive material to obtain level surfaces for facilitating the planarization.

Whereas modifications of the present invention will no doubt be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method for forming multilevel interconnections in a semiconductor device, comprising the sequential steps of:

forming a first silicon oxide film on a semiconductor substrate;

forming a first photo-resist film pattern on the first silicon oxide film;

exposing the surface of the silicon oxide film not covered with the photo-resist film pattern to a super-saturated hydrosilicofluoric acid solution to selectively deposit a first fluoro-containing silicon oxide film on the silicon oxide film using the first photo-resist film pattern as a mask;

removing the first photo-resist film pattern to form first grooves in the fluoro-containing silicon oxide film;

forming a first metal film extending within said first grooves and over said first fluoro-containing silicon oxide film;

subjecting said first metal film to a first chemical and mechanical polishing to leave said metal film only within said first grooves so that a remaining first metal film has a top surface at a same level as a top surface of said first fluoro-containing silicon oxide film to form a first flat top surface of said substrate;

forming a second silicon oxide film on the first flat top surface of device; said substrate;

selectively forming a second photo-resist film pattern on said second silicon oxide film;

exposing an entire surface of the device covered with the second photo-resist film pattern to a super-saturated hydrosilicofluoric acid solution to selectively deposit a second fluoro-containing silicon oxide film on the second silicon oxide film using the second photo-resist film pattern as a mask;

removing the second photo-resist film pattern to form second grooves in the second fluoro-containing silicon oxide film;

removing the second silicon oxide film from within the second grooves;

forming a second metal film extending within said second grooves and over said second fluoro-containing silicon oxide film;

subjecting said second metal film to a second chemical and mechanical polishing to leave said second metal film only within said second grooves so that a remaining second metal film has a top surface at a same level as a top surface of said second fluoro-containing silicon oxide film to form a second flat top surface of said substrate;

selectively forming a third photo-resist film pattern on said second fluoro-containing silicon oxide film;

exposing an entire surface of the device covered with the third photo-resist film pattern to a super-saturated hydrosilicofluoric acid solution to selectively deposit a third fluoro-containing silicon oxide film on the second fluoro-containing silicon oxide film using the third photoresist film pattern as a mask;

removing the third photo-resist film pattern to form third grooves in the third fluoro-containing silicon oxide film;

forming a third metal film extending within said third grooves and over said third fluoro-containing silicon oxide film; and subjecting said third metal film to a third chemical and mechanical polishing to leave said third metal film only within said third grooves so that a remaining third metal film has a top surface at a same level as a top surface of said third fluoro-containing silicon oxide film to form a third flat top surface of said substrate.

2. The method as claimed in claim 1, wherein during the steps of forming of the first, second and third fluoro-containing silicon oxide films, the hydrosilicofluoric acid solution is maintained at a temperature of 35° C. so that the solubility of aluminum to 1 liter of hydrosilicofluoric acid solution is set at approximately 0.5 g/hour.

3. The method as claimed in claim 1, further comprising the step of:

forming a base film mainly containing silicon oxide on the entire surface of the device prior to the formation of the second photo-resist film.

4. The method as claimed in claim 1, wherein the step for forming the first, second, and third metal films comprises the following steps of:

forming a titanium film on an entire surface of the device by sputtering;

forming a titanium nitride film on the titanium film by sputtering;

forming an aluminum film on the titanium nitride film by a thermal chemical vapor phase deposition carried out by the following steps of:

vaporizing dimethylaluminumhydride $AlH(CH_3)_2$ by a bubbling method with a carrier gas of hydrogen at a temperature of 30° C.; and introducing the vaporized dimethylaluminumhydride $AlH(CH_3)_2$ into a reaction chamber, where a flow rate of hydrogen gas is controlled at 250 sccm, a temperature of the substrate is maintained at 250° C. and a pressure of the reaction chamber is 130 Pa.

* * * * *